United States Patent
Takeda et al.

(10) Patent No.: US 11,772,356 B2
(45) Date of Patent: Oct. 3, 2023

(54) TRANSLUCENT STRUCTURE

(71) Applicant: AGC Inc., Chiyoda-ku (JP)

(72) Inventors: Yosuke Takeda, Chiyoda-ku (JP); Toru Ikeda, Chiyoda-ku (JP); Makoto Fukawa, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 316 days.

(21) Appl. No.: 15/891,513

(22) Filed: Feb. 8, 2018

(65) Prior Publication Data

US 2018/0162091 A1 Jun. 14, 2018

Related U.S. Application Data

(63) Continuation of application No. PCT/JP2017/003462, filed on Jan. 31, 2017.

(30) Foreign Application Priority Data

Feb. 1, 2016 (JP) .................................. 2016-017083

(51) Int. Cl.
 B32B 3/30 (2006.01)
 B32B 7/02 (2019.01)
 (Continued)

(52) U.S. Cl.
 CPC ................ B32B 3/30 (2013.01); B32B 17/06 (2013.01); G02B 1/11 (2013.01); G02B 1/113 (2013.01);
 (Continued)

(58) Field of Classification Search
 CPC ............ G02B 1/11; G02B 1/113; G02B 1/115
 See application file for complete search history.

(56) References Cited

U.S. PATENT DOCUMENTS

| | | | |
|---|---|---|---|
| 8,974,066 B2 | 3/2015 | Kalyankar et al. | |
| 2002/0028328 A1* | 3/2002 | Onozawa | B32B 5/16 428/331 |

(Continued)

FOREIGN PATENT DOCUMENTS

| | | |
|---|---|---|
| DE | 11 2016 003 903 T5 | 5/2018 |
| JP | 2006-267839 | 10/2006 |

(Continued)

OTHER PUBLICATIONS

International Search Report dated Mar. 7, 2017 in PCT/JP2017/003462 filed Jan. 31, 2017.

*Primary Examiner* — Laura A Auer
(74) *Attorney, Agent, or Firm* — Oblon, McClelland, Maier & Neustadt, L.L.P.

(57) ABSTRACT

To provide a translucent structure having a low haze factor and low sparkle. The translucent structure has an uneven structure at the surface thereof, wherein the uneven structure includes first convex portions 5a, of which the diameters at a height of the bearing height+0.05 μm of the surface shape (a), obtainable by measuring the uneven structure by a laser microscope, are at least 1 μm, and in an image (c) in which a plurality of convex portions are scattered, obtained by filtering the surface shape (a) by image processing software to obtain a smoothing image (b), and subtracting XYZ data of the smoothing image (b) from XYZ data of the surface shape (a), said plurality of convex portions include second convex portions 5b, of which the diameters at a height of 0.01 μm when the bearing height is deemed to be 0, are at least 0.4 μm, the density of the second convex portions is from 0.023 to 7.210 units/μm², and the proportion of the total area in cross-section at a height of 0.01 μm of the second convex portions 5b is from 0.900 to 90.000%.

20 Claims, 9 Drawing Sheets

(51) Int. Cl.
  *B32B 17/06* (2006.01)
  *G02B 5/02* (2006.01)
  *G02B 1/11* (2015.01)
  *G02B 1/113* (2015.01)
  *G02B 1/115* (2015.01)
  *G02B 1/14* (2015.01)
  *G02B 1/18* (2015.01)
  *H10K 50/854* (2023.01)
  *H10K 77/10* (2023.01)

(52) U.S. Cl.
  CPC ............... *G02B 1/115* (2013.01); *G02B 1/14* (2015.01); *G02B 1/18* (2015.01); *G02B 5/0205* (2013.01); *G02B 5/0221* (2013.01); *G02B 5/0247* (2013.01); *G02B 5/0278* (2013.01); *H10K 50/854* (2023.02); *H10K 77/10* (2023.02)

(56) References Cited

U.S. PATENT DOCUMENTS

| | | | | |
|---|---|---|---|---|
| 2003/0234460 | A1* | 12/2003 | Hayashi | B29C 59/026 264/2.7 |
| 2004/0005436 | A1* | 1/2004 | Mori | B29C 45/14811 428/141 |
| 2006/0061868 | A1* | 3/2006 | Hattori | G02B 1/11 359/603 |
| 2010/0177398 | A1* | 7/2010 | Watanabe | G02B 1/105 359/614 |
| 2010/0279070 | A1 | 11/2010 | Richter et al. | |
| 2011/0003121 | A1 | 1/2011 | Tsuda | |
| 2012/0268822 | A1* | 10/2012 | Law | G02B 1/118 359/580 |
| 2012/0300304 | A1* | 11/2012 | Gollier | C03C 21/002 359/599 |
| 2013/0236697 | A1* | 9/2013 | Walker, Jr. | G02B 1/118 428/152 |
| 2013/0271836 | A1 | 10/2013 | Fukaya et al. | |
| 2015/0022475 | A1* | 1/2015 | Watanabe | G06F 3/041 345/173 |
| 2015/0261332 | A1* | 9/2015 | Nakamura | G06F 3/0412 345/173 |

FOREIGN PATENT DOCUMENTS

| | | | |
|---|---|---|---|
| JP | 2009-058640 | 3/2009 | |
| JP | 2009-061686 | 3/2009 | |
| JP | 2009-085665 | 4/2009 | |
| JP | 4893539 | 3/2012 | |
| JP | 2013-156523 | 8/2013 | |
| JP | 2013-214059 | 10/2013 | |
| JP | 2014206728 A * | 10/2014 | ........... G02B 5/0221 |
| WO | WO 2009/144970 A1 | 12/2009 | |
| WO | WO 2014/034720 A1 | 3/2014 | |
| WO | WO 2014/148492 A1 | 9/2014 | |
| WO | WO 2016/021560 A1 | 2/2016 | |

* cited by examiner (a)

(b)

(c)

Density (number/μm$^2$) of second convex portions

Area ratio (%) of second convex portions

TRANSLUCENT STRUCTURE

TECHNICAL FIELD

The present invention relates to an antiglare translucent structure having a low haze factor and low sparkle.

BACKGROUND ART

In an image display device (such as a liquid crystal display, an organic EL display, a plasma display, etc.) installed in various instruments (such as TV, a personal computer, a smart phone, a cellular phone, a vehicle, etc.), if external light of e.g. indoor lighting (such as a fluorescent lamp, etc.), sunlight, etc. is reflected on the display surface, the visibility is reduced by the reflected image.

In order to suppress such reflection of external light, it has been common to apply antiglare treatment on the surface of a substrate (such as a glass plate) constituting the display surface of an image display device. Antiglare treatment is treatment of forming unevenness on the surface, to let incident light be scattered by such unevenness. As incident light is diffusely reflected, the reflected image becomes blurred, whereby the external light reflection is suppressed. As such antiglare treatment, a method of etching the surface of a substrate, or a method of providing an antiglare layer having unevenness on the surface, is known. As the method for forming an antiglare layer, a method is known wherein a coating liquid containing a silica precursor such as a hydrolytic condensate of an alkoxysilane is applied on a substrate by a spray method, followed by baking (e.g. Patent Document 1).

However, when antiglare treatment is applied on the surface of a substrate, the haze factor tends to increase, thus leading to such a problem that visibility of the image tends to be reduced. To solve such a problem, antiglare articles having antireflection properties such as the following (1) to (3) have been proposed. By such antiglare articles, it is said that as they have antireflection properties, reflection of incident light is suppressed, whereby image resolution and contrast as well as light transmittance will be improved, and visibility of the image will be improved.

(1) An antiglare-antireflection member comprising a substrate provided with an antiglare layer having an uneven structure at its surface layer, and an antireflection layer provided on the antiglare layer (Patent Document 2).

(2) A touch screen provided with an antiglare layer, wherein the antiglare layer contains aggregate inorganic oxide particles in a cured inorganic polymer matrix, and the inorganic oxide particles form a surface structure with a size exceeding 2 μm and at most about 100 μm (Patent Document 3).

(3) An antiglare panel comprising a transparent substrate and an antiglare coating formed on the transparent substrate, wherein the antiglare coating contains a plurality of plate-form silica particles, and at least some of the plate-form silica particles form a plurality of flower-shaped structures (tertiary particles) (Patent Document 4).

On the other hand, when a substrate subjected to antiglare treatment is disposed on a display surface of an image display device, sparkle is likely to occur on the display surface by the presence of unevenness, thus leading to such a problem that visibility of an image tends to decrease. Such sparkle tends to be strong, as antiglare properties become high.

As an antiglare coating capable of suppressing such sparkle, the following (4) has been proposed.

(4) An antiglare coating provided with an antiglare layer having a plurality of regions separated on a substrate, wherein unevenness is formed between the regions and the substrate, and the surface in the convex portion regions is formed to be flat or to have at least one uneven portion (Patent Document 5).

PRIOR ART DOCUMENTS

Patent Documents

Patent Document 1: JP-A-2009-058640
Patent Document 2: WO 2014/034720
Patent Document 3: U.S. Patent Application Publication No. 2010/0279070
Patent Document 4: U.S. Pat. No. 8,974,066
Patent Document 5: JP-A-2013-214059

DISCLOSURE OF INVENTION

Technical Problem

The antiglare-antireflection member in Patent Document 2 and the touchscreen in Patent Document 3, have a sparkle problem similar to the case where conventional common anti-glare treatment is applied. The antiglare panel in Patent Document 4 has a high haze factor, whereby visibility of the image is not sufficient.

The antiglare coating in Patent Document 5 can suppress sparkle to some extent, but the effect is not sufficient. In recent years, the pixel density of a liquid crystal display tends to increase, and as the pixel density becomes high, sparkle becomes strong even when the uneven structure is the same. Therefore, further reduction of glare is required.

It is an object of the present invention to provide an antiglare translucent structure having a low haze factor and low sparkle, and an article and an image display apparatus provided therewith.

Solution to Problem

The present invention has the following construction.

A translucent structure having an uneven structure at the surface thereof, wherein the uneven structure includes first convex portions, of which the diameters (calculated as true circles) at a height of the bearing height+0.05 μm of the surface shape, obtainable by measuring a region of from (101 μm×135 μm) to (111 μm×148 μm) of the uneven structure by a laser microscope, are at least 1 μm, and the average value of the diameters (calculated as true circles) of the first convex portions is from 1.000 to 16.000 μm, and in an image having a plurality of convex portions, obtained by filtering the surface shape by image processing software SPIP (manufactured by Image Metrology) to obtain a smoothing image and subtracting XYZ data of the smoothing image from XYZ data of the surface shape, said plurality of convex portions include second convex portions, of which the diameters (calculated as true circles) at a height of 0.01 μm when the bearing height is deemed to be 0, are at least 0.4 μm, the density of said second convex portions is from 0.023 to 7.210 units/μm$^2$, and the total area in cross section of the second convex portions at a height of 0.01 μm is from 0.900 to 90.000% of the entire area of said region.

Advantageous Effects of Invention

According to the present invention, it is possible to provide an antiglare translucent structure having a low haze factor and low sparkle, and an article and an image display apparatus provided therewith.

The translucent structure of the present invention has antiglare properties, and therefore, when the translucent structure of the present invention is disposed at the display surface of an image display device, external light will be diffusely reflected by the uneven structure at the surface of the translucent structure, whereby the reflected image becomes blurred, and it is possible to suppress a decrease in visibility of the image due to reflection of external light on the display surface. Further, the translucent structure of the present invention has a low haze factor, and sparkle is less likely to occur at the surface of the uneven structure, whereby a decrease in resolution or contrast of the image, a decrease in transmittance of light, or a decrease in visibility of the image due to sparkle at the display surface, by disposing the translucent structure, is less likely to occur.

DESCRIPTION OF EMBODIMENTS

The following definitions of terms apply throughout the specification including claims.

The term "translucent" means that visible light is permeable.

The "bearing height" is a value of the most prevalent height Z, in a height distribution histogram obtainable from XYZ data of the surface shape in an observation region, obtainable by measuring a region (hereinafter referred to also as an observation region) of from (101 μm×135 μm) to (111 μm×148 μm) by a laser microscope. Height Z in the XYZ data is, unless otherwise particularly specified, the height based on the lowest point (position where the value of Z takes the minimum value) in the observation region (i.e. the length of a perpendicular line extending from the position for measuring height Z downward to a plane containing the lowest point, i.e. a plane parallel to the main surface of the translucent structure, in the observation region), and in the following, the same applies to the meaning of height in the surface shape unless otherwise particularly specified. The width (bin) of each section in the height distribution histogram is set to be 1,000.

In XYZ data, the Z direction is a height direction of the uneven structure (the thickness direction of the translucent structure), and the XY plane is a plane perpendicular to the Z direction.

The expression "to" representing a numerical range, is used in the sense of including the numerical values described before and after the expression as the lower limit and upper limit values, respectively.

《Translucent Structure》

First Embodiment

Figure 1:
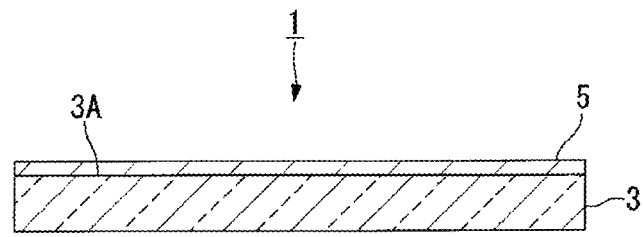
FIG. 1 is a cross-sectional view schematically showing a translucent structure in a first embodiment of the present invention.

In FIG. 1, a translucent structure 1 in this embodiment comprises a translucent substrate 3 and an antiglare layer 5 formed on the first surface 3A thereof. The antiglare layer 5 has an uneven structure at the surface. The surface of the antiglare layer 5 constitutes the surface of the translucent structure 1. Therefore, the translucent structure 1 has an uneven structure at the surface. In FIG. 1, the ratio of the thickness of the antiglare layer 5 to the thickness of the translucent substrate 3 is made larger than the actual ratio, for convenience sake.

(Translucent Substrate)

The translucent substrate 3 may be any one so long as it can transmit visible light, and preferred is one which is transparent. Being transparent in the translucent substrate 3 means that it transmits light in a wavelength range of from 400 to 1,100 nm at least 80% on average (i.e. the average transmittance is at least 80%). The average transmittance of light in the wavelength range of from 400 to 1,100 nm is measured by using an integrating sphere.

Material for the translucent substrate 3 may, for example, be glass, a resin, etc. The glass may, for example, be soda lime glass, borosilicate glass, aluminosilicate glass, alkali-free glass, etc. The resin may, for example, be polyethylene terephthalate, polycarbonate, triacetyl cellulose, polymethyl methacrylate, etc.

The form of the translucent substrate 3 may, for example, be a plate, a film, etc.

The first surface 3A of the translucent substrate 3 may be smooth or may have irregularities. From the viewpoint of usefulness for providing an antiglare layer 5, it is preferably smooth. Arithmetic average roughness Ra of the first surface 3A is preferably at most 10 nm, more preferably at most 5 nm, further preferably at most 2 nm, particularly preferably at most 1 nm. Ra here is a value measured by the atomic force microscope (AFM) mode of scanning probe microscope multifunction unit SPA-400 manufactured by SII Nano Technology Inc.

The shape of the translucent substrate 3 may be, not only a flat shape as illustrated, but also a shape having a curved surface. Recently, among various instruments provided with image display devices, there are ones wherein the display surface of an image display device is curved. A translucent structure 1 wherein the translucent substrate 3 has a shape having a curved surface, is useful for such an image display device.

In a case where the translucent substrate 3 has a curved surface, the surface of the translucent substrate 3 may be entirely curved or may be composed of a curved part and a flat part. As an example of the case where the entire surface is curved, a case may, for example, be mentioned where the cross-section of the translucent substrate 3 is a circular arc shape. It should be mentioned that the curved surface here is a macroscopic curved surface of such a level that is negligible in the observation region to be observed by a laser microscope.

In a case where the translucent substrate 3 has a curved surface, the radius of curvature (hereinafter referred to also as "R") of the curved surface may suitably be set depending on the application of the translucent structure 1, the type of the translucent substrate 3, etc., and It is, although not particularly limited, preferably at most 25,000 mm, more preferably from 10 to 5,000 mm, particularly preferably from 50 to 3,000 mm. When R is at most the above upper limit value, as compared to a flat plate, it is excellent in design property. When R is at least the above lower limit value, it is possible to form an antiglare layer uniformly even on the curved surface.

As the translucent substrate 3, a glass plate is preferred. The glass plate may be a smooth glass plate formed by a float method, a fusion method, a down draw method or the like, or may be a figured glass having an uneven surface formed by a roll-out method or the like. Further, it may be not only a glass plate of a flat shape, but also a glass plate having a curved surface. In a case where the glass plate has a curved surface, the preferred radius of curvature of the curved surface is the same as described above.

The thickness of the translucent substrate 3 is not particularly limited. For example, it is possible to use a glass plate having a thickness of at most 10 mm, preferably from 0.5 to 3 mm. When the thickness is thin, it is possible to suppress absorption of light to be low, such being preferred for an application intended to improve transmittance. Further, the thickness being thin will contribute to weight reduction of the translucent structure 1.

The glass plate is preferably a tempered glass plate. The tempered glass plate is a glass plate subjected to air cooling tempering or chemical tempering treatment. By the tempering treatment, the strength of glass will be improved, and it is possible to reduce the plate thickness while maintaining the strength.

(Antiglare Layer)

An antiglare layer 5 has an uneven structure at the surface.

Figure 2:
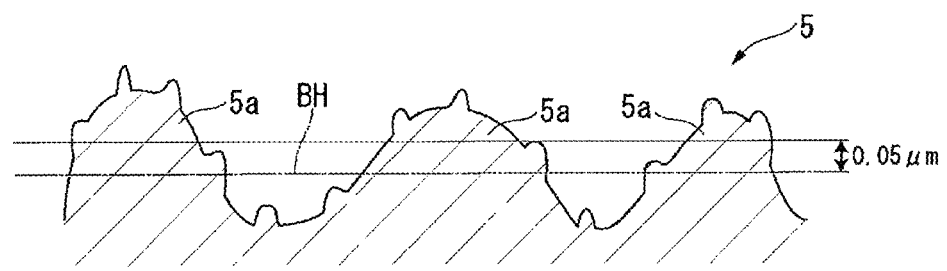
FIG. 2 is a view schematically illustrating the structure near the surface of the translucent structure in the first embodiment.
Figure 3:
FIG. 3 is a view illustrating the relation of the surface shape of the translucent structure in the first embodiment, its smoothing image, and the image obtainable as the difference of their XYZ data.
Figure 3:
Figure 3:
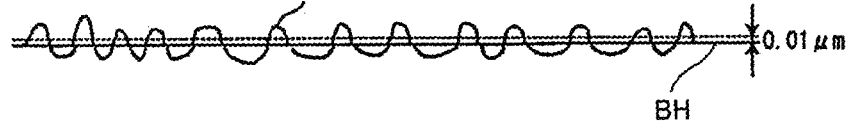

The uneven structure at the surface of the antiglare layer 5 (i.e. at the surface of the translucent structure 1) includes, as shown in FIG. 2 and FIG. 3(a), first convex portions 5a, of which diameters (calculated as true circles) at a height of the bearing height+0.05 μm in the surface shape of the antiglare layer 5 (i.e. in the surface shape of the translucent structure 1) are at least 1 μm. Symbol "BH" in FIG. 2 represents the bearing height. First convex portions 5a are present in a plurality, and by the plurality of first convex portions 5a, undulation is formed at the surface of the antiglare layer 5.

Further, with respect to the surface shape of the antiglare layer 5, when filtering the surface shape by image processing software SPIP (manufactured by Image Metrology) to obtain a smoothing image as shown in FIG. 3(b) and subtracting XYZ data of the smoothing image from XYZ data of the surface shape, an image is obtainable wherein a plurality of convex portions are scattered as shown in FIG. 3(c). In the image wherein a plurality of convex portions are scattered, the plurality of convex portions include second convex portions 5b, of which the diameters (calculated as true circles) at a height of 0.01 μm are at least 0.4 μm. The second convex portions 5b are present in a plurality. The second convex portions 5b in this embodiment are typically distributed like islands on the undulation formed by the plurality of first convex portions 5a.

In the antiglare layer 5, locally there may be portions where the translucent substrate 3 is exposed.

The above-mentioned surface shape is one obtainable by measuring the observation region of the surface of the antiglare layer 5 (the surface of the translucent structure 1) by a laser microscope.

The observation region is within a rectangular range of short side of from 101 to 111 μm×long side of from 135 to 148 μm. That is, the observation region is within a rectangular range of 101 μm×135 μm at the minimum, and within a rectangular range of 111 μm×148 μm at the maximum. The vertical×horizontal ratio (long side length/short side length) is usually in a range of from about 1.21 to 1.46.

Here, the reason for describing the observation region by the range, is that even by using an objective lens having the same magnification, the observation region may be different depending upon individual differences of the lens. Since measurement results are represented by the maximum, minimum and average values in the observation region, even if the observation region is slightly different, so long as an objective lens of the same magnification is selected for use, there will be no substantial difference in the results.

The observation region to be measured by a laser microscope is one location selected at random from the surface of the antiglare layer 5 (the surface of the translucent structure 1). Detailed measurement conditions by the laser microscope are as shown in Examples described later.

The analysis to obtain the image wherein a plurality of convex portions are scattered on the above-mentioned plane, can be conducted specifically by the procedure of the following (i) to (iv).

(i) In a custom mode, inclination correction of XYZ data of the surface shape of the antiglare layer 5 actually measured, was carried out to obtain a surface shape image having the bearing height corrected to be 0.

(ii) With respect to the surface shape image having the bearing height corrected to be 0, under conditions of "convolution: smoothing: set to be the average" and "kernel size X=Y=31, set to be circular", 31 XY data were subjected to filtering to average Z by circular units, to obtain a smooth uneven surface shape image (hereinafter referred to also as a "smoothing image (b)") as shown in FIG. 3(b).

(iii) From the above surface shape image having the bearing height corrected to be 0, "particles" are detected at a threshold level: 0.01 μm. Then, in the measurement of the image window, "Filter difference" and "Save whole of shape" are selected, and post-processing of "smoothing the shape contours" in a filter size of 51 points, is carried out to obtain a post-processed surface shape image (hereinafter referred to also as a "surface shape (a)") as shown in FIG. 3(a).

(iv) As the difference between the smoothing image (b) and the surface shape (a), a shape image (hereinafter referred to also as an "image (c)") wherein a plurality of convex portions are scattered, is obtained as shown in FIG. 3(c).

The "custom mode" in the above (i) is a mode which is displayed at the time when the inclination correction (flattening) is conducted by SPIP, and specifically, the following four operations are carried out automatically.

(i-1) As "General plane correction method", "Average profile fit method" is selected, and the order is 3.

(i-2) "Process step" is not selected.

(i-3) For "Correction of a line-by-line basis", "No" is selected.

(i-4) As "Z offset method", "Bearing height to zero" is selected.

When the above inclination correction is carried out, with respect to XYZ data of the surface shape obtained by a laser microscope, fitting surfaces are calculated from the average profiles of X and Y, and by subtracting them from the image, inclination or unwanted bending of the entire image is removed.

In the above (ii), if the kernel size is set to be X=Y=31, circular, a substitute frame (kernel) for circular, being octagonal inscribed in a rectangle of 31×31, is set. In filtering, regardless the kernel shape, the original data is replaced by a simple average of all points in the kernel.

When filtering is carried out, a smoothing image (b) having fine irregularities removed (averaged) is obtainable as shown in FIG. 3(b).

As the averaging filter of SPIP, a filter of 31×31 was used. Details will be shown in the following matrix operation.

One point: For XYZ, 961 points are extracted along circularly around this point (a short distance forward), values of Z against XY at the respective points are totaled, the totaled value is divided by 961 to obtain a value which is regarded as a new Z value of the coordinates XY. This calculation is performed for all points in the plane.

The distances of measurement points in the X direction and Y direction, are each 71 nm.

At that time, the average is obtained for all the points while moving from one point to the next, and therefore, there will be no possibility that the resolution is lowered.

$$C = \frac{1}{961} \begin{bmatrix} 1 & 1 & \dots & 1 \\ \vdots & \vdots & & \vdots \\ 1 & 1 & \dots & 1 \\ 1 & 1 & \dots & 1 \end{bmatrix}$$

Y direction: 31 points

X direction: 31 points

In the above (iii), the threshold level being 0.01 μm indicates that as particles (convex portions), ones having a height of at least 0.01 μm, are to be detected. The height is one based on the bearing height.

In post-processing, "Save whole of shape" indicates such an operation that when there is a concave portion having a height of at most 0.01 μm in the region of the detected particles, the area of such a concave portion is not counted as the area of the particles.

"Smoothing the shape contours" indicates an operation of removing a noise of the shape contours of particles.

The filter size represents the degree of smoothing of the shape contours of particles, and as the value is larger, the shape contour after smoothing becomes closer to a circle.

That is, the surface shape (a) obtainable by post-processing in (iii) is one wherein a noise has been removed from the actually measured data, and the shape contours of the convex portions are regulated, and thus, it can be regarded as the uneven surface shape containing the actual first convex portions.

In (iv), by subtracting the surface shape (a) obtained in (iii) from the smoothing image (b) obtained in (ii), the image (c) is obtainable.

In general, if convex portions are distributed over a surface with undulation, it is difficult to accurately measure the number and shape of the convex portions. In the above shape analysis, when the smoothing image (b) and the surface shape (a) are superimposed, convex portions located above the surface of the smoothing image (b), are defined as convex portions distributed on a surface obtained by eliminating the undulation of the surface with undulation.

First convex portions 5a are convex portions, of which cut surfaces are observed at a "height of the bearing height+0.05 μm of the surface shape", and they are convex portions, of which the diameters (calculated as true circles) calculated from the areas of the cut surfaces, are at least 1 μm.

The upper limit value for the diameters of the first convex portions 5a (calculated as true circles) is not particularly limited so long as the average diameter described later is within a specific range, but it is typically at most 16 μm.

The average value (hereinafter referred to also as the "average diameter") of the above diameters (calculated as true circles) of the first convex portions 5a is from 1.000 to 16.000 μm, preferably from 1.000 to 12.000 μm, particularly preferably from 1.000 to 8.000 μm. When the above average diameter is at least the lower limit value in the above range, antiglare properties will be good. When the average diameter is at most the upper limit value in the above range, low glare properties will be excellent.

The density of the first convex portions 5a in the surface shape is preferably from 0.001 to 1.15 units/$\mu m^2$, more preferably from 0.001 to 0.1 units/$\mu m^2$, particularly preferably from 0.001 to 0.050 units/$\mu m^2$. When the above density is at least the lower limit value in the above range, antiglare properties will be more excellent. When the density is at most the upper limit value in the above range, low sparkle properties will be more excellent.

The ratio (hereinafter referred to as the "area ratio") of the total area of the cross sections of the first convex portions 5a at a height of the bearing height+0.05 $\mu m$ of the surface shape, to the entire area of the observation region, is preferably from 2.00 to 90.75%, more preferably from 2.00 to 70.00%, particularly preferably from 2.00 to 50.00%. When the area ratio is at least the lower limit value in the above range, antiglare properties will be more excellent. When the area ratio is at most the upper limit value in the above range, low sparkle properties will be more excellent.

The entire area of the observation region is equal to the entire area of the cross section including space portions, at a height of the bearing height+0.05 $\mu m$ of the surface shape.

The second convex portions 5b are convex portions, of which cut surfaces are observed at a height of 0.01 $\mu m$ of the image (c) obtainable as the difference between the XYZ data of the surface shape (a) and the smoothing image (b) (at a height based on the lowest point of the image (c) i.e. the position of the bearing height plane), and they are convex portions, of which the diameters (calculated as true circles) calculated from the areas of the cut surfaces, are at least 0.4 $\mu m$. When the above diameters are at least 0.4 $\mu m$, it is possible to suppress sparkle by inhibiting interference among visible lights refracted at the surface of the first convex portions 5a. If the diameters are less than 0.4 $\mu m$, since they are smaller than the wavelength of visible light, there is a possibility that the above effect cannot be obtained.

The upper limit value for the diameters (calculated as true circles) of the second convex portions 5b is not particularly limited so long as the after-described density and area ratio will be within the specific ranges, but it is typically at most 2.000 $\mu m$.

The average value of the above diameters (calculated as true circles) of the second convex portions 5b (hereinafter referred to also as the "average diameter") Is preferably 0.400 to 2.000 $\mu m$, more preferably from 0.500 to 1.800 $\mu m$, particularly preferably from 0.600 to 1.500 $\mu m$. When the above average diameter is within the above range, low sparkle properties will be excellent.

The density of the second convex portions 5b in the image (c) is from 0.023 to 7.210 units/$\mu m^2$, preferably from 0.023 to 0.180 unit/$\mu m^2$, particularly preferably from 0.033 to 0.180 unit/$\mu m^2$. When the density is within the above range, low sparkle properties will be excellent.

In the image (c), the ratio (hereinafter referred to also as the "area ratio") of the total area in cross section of the second convex portions 5b at a height of 0.01 $\mu m$ when the bearing height is deemed to be 0, to the entire area of the observation region, is from 0.900 to 90.000%, preferably from 1.000 to 22.400%, particularly preferably from 1.270 to 16.000%. When the above area ratio is within the above range, low glare properties will be excellent. The entire area of the observation area is equal to the entire area of the cross section including space portions, at a height of 0.01 $\mu m$ of the image (c).

Characteristics such as the average diameter, density, area ratio, etc. of each of the first convex portions 5a and the second convex portions 5b, can be obtained by analyzing the data of the surface shape measured by a laser microscope, by image processing software SPIP (manufactured by Image Metrology). The detailed analysis method is as shown in Examples described later.

At the surface of the antiglare layer 5, i.e. in the uneven structure at the surface of the translucent structure 1, the half width of the projection distribution is preferably from 10 to 300 nm, more preferably from 30 to 250 nm. The half-width of the projection distribution represents uniformity in the average height of the convex portions in the uneven surface structure and also represents average sharpness in shape of the convex portions, and it shows that as the value of the half width of the protruding portions is small, uniformity in the average height of the convex portions in the uneven surface structure is high, and the shape of the convex portions is sharp. The convex portions here correspond mainly to the first convex portions 5a. As uniformity in the average height of the convex portions is high, the film strength will be excellent. On the other hand, as the shape is sharp, sparkle suppressing effects will be excellent. In a region where the haze factor is from 0.1 to 15%, if the half width of the projection distribution is at least 500 nm i.e. the shape of convex portions is gentle, it is difficult to satisfy both of the haze factor and glare suppression effects, and especially in a case where the haze factor is from 0.1 to 5%, it is difficult to obtain sufficient sparkle suppressing effects.

The refractive index of the antiglare layer 5 is preferably from 1.36 to 1.46, more preferably from 1.40 to 1.46, particularly preferably from 1.43 to 1.46. When the refractive index is at most the upper limit value in the above range, the reflectance of external light at the surface of the antiglare layer 5 is reduced, and anti-glare effects will be more excellent. When the refractive index is at least the lower limit value in the above range, the density of the antiglare layer 5 will be sufficiently high, and adhesion to the transparent substrate 3 such as a glass plate will be excellent.

The refractive index of the antiglare layer 5 can be adjusted by e.g. the matrix material or porosity of the antiglare layer 5, or by addition of a substance having an optional refractive index into the matrix. For example, it is possible to lower the refractive index by increasing the porosity of the antiglare layer 5. Otherwise, it is possible to lower the refractive index of the antiglare layer 5 by adding a material (such as solid silica particles, hollow silica particles, etc.) having a low refractive index into the matrix.

The material for the antiglare layer 5 can be suitably set in consideration of the refractive index, etc. In a case where the refractive index of the antiglare layer 5 is from 1.40 to 1.46, the material for the antiglare layer 5 may, for example, be silica, titania, etc.

The antiglare layer 5 is preferably a film composed mainly of silica. By "composed mainly of silica", it is meant to contain at least 90 mass % of $SiO_2$. When it is composed mainly of silica, the refractive index (reflectance) of the antiglare layer 5 is likely to be low. Further, the chemical stability of the antiglare layer 5 will also be good. Further, in a case where the material of the translucent substrate 3 is glass, adhesion to the translucent substrate 3 will be good. Further, in a case where a predetermined uneven structure is formed by using a photocurable resin and fine particles, the pencil hardness of the uneven surface is about 2H, whereas in a case where it is formed by using a material composed mainly of silica, it is possible to bring the pencil hardness of the uneven surface to be at least 5H. At such a pencil hardness, i.e. when the pencil hardness of the uneven surface of the translucent structure 1 is at least 5H, scratch resistance will be excellent. The pencil hardness is measured in accordance with JIS K5600-5-4. Evaluation was carried out at the surface having the uneven structure of the translucent structure.

When composed mainly of silica, the antiglare layer 5 may be composed solely of silica, or may contain a small amount of components other than silica.

(Haze Factor)

The haze factor of the translucent structure 1 is preferably from 0.1 to 15.0%, more preferably from 0.2 to 10.0%, particularly preferably from 0.5 to 5.0%. When the haze factor is at least the lower limit value in the above range, antiglare properties will be more excellent. When the haze factor is at most the upper limit value in the above range, it is less likely to impair the visibility of an image when disposed at the display surface of an image display device.

The haze factor is measured in accordance with the method disclosed in JIS K7136; 2000 (ISO14782, 1999), by using a haze meter (manufactured by Murakami Color Research Laboratory Co., Ltd. HR-100 Model).

(Gloss)

The 60° specular gloss at the surface (the surface of the antiglare layer 5) having a uneven structure of the translucent structure 1 is preferably at most 140%, more preferably at most 135%, further preferably at most 130%. The 60° specular gloss at the surface having the uneven structure is an index for the anti-glare effects. When said specular gloss is at most the above upper limit value, sufficient antiglare effects will be exhibited.

The 60° specular gloss (%) is measured in accordance with the method disclosed in JIS Z8741; 1997 (ISO2813, 1994), by using a gloss meter (MULTI GLOSS 268 Plus, manufactured by Konica Minolta, Inc.), at substantially the center of the antiglare layer without erasing reflection at the back surface (surface opposite to the side where the uneven structure is formed) of the translucent structure.

(Sparkle Index Value S)

Of the translucent structure 1, the sparkle index value S to be measured by using EyeScale ISC-A manufactured by I System Corporation by placing the translucent structure 1 on iPhone 4 (pixel density 326 ppi) manufactured by Apple Inc. so that the surface (the surface of the antiglare layer 5 side) having the uneven structure is directed upwards, is preferably at most 36, more preferably at most 30, particularly preferably at most 25. The sparkle index value S being small means that the sparkle is suppressed.

The translucent structure 1 as described above has a specific uneven structure at the surface (the surface of the antiglare layer 5 side), whereby it has antiglare properties, and also has a low haze factor to provide low-sparkle properties.

In the translucent structure 1, the first convex portions 5a are considered to mainly contribute to the antiglare properties by diffusely reflecting external light, and the second convex portions 5b are considered to mainly contribute to the suppression of sparkle. In a case where the uneven structure does not include the second convex portions 5b at a density and area ratio of at least certain levels, lights entered into the antiglare layer 5 from the transparent substrate 3 side, are refracted at the surface of the first convex portions 5a, and the refracted lights are considered to interfere one another to cause sparkle near the surface of the first convex portions 5a. The second convex portions 5b are considered to inhibit the interference of the refracted lights one another to suppress sparkle.

<Method for Producing Translucent Structure>

The translucent structure 1 may, for example, be produced by applying a coating composition to form a coating film on a translucent substrate 3, followed by firing the coating film to form a glare layer 5. The coating composition comprises, for example, at least one of silica precursor (A) and particles (C), and a liquid medium (B).

(Silica Precursor (A))

The "silica precursor" means a substance capable of forming a matrix composed mainly of silica. As the silica precursor (A), a silane compound such as a known alkoxysilane or its hydrolyzed condensate may suitably be used. As the silica precursor (A), one type may be used alone, or two or more types may be used in combination.

The silica precursor (A) preferably contains either one or both of an alkoxysilane having a carbon atom directly bonded to a silicon atom and its hydrolyzed condensate, from the viewpoint of preventing cracking or film peeling of the antiglare layer 5. The silica precursor (A) preferably contains either one or both of a tetraalkoxysilane and its hydrolyzed condensate, from the viewpoint of the abrasion strength of the antiglare layer 5.

(Liquid Medium (B))

The liquid medium (B) is one to dissolve or disperse the silica precursor (A), and one to disperse the particles (C) is preferably used. The liquid medium (B) may be one which has both of a function to dissolve or disperse the silica precursor (A) and a function as a dispersion medium to disperse the particles (C).

The liquid medium (B) comprises at least a liquid medium (B1) having a boiling point of at most 150° C. The above boiling point is preferably from 50 to 145° C., more preferably from 55 to 140° C. When the boiling point of the liquid medium (B1) is at most 150° C., a film obtainable by applying the coating composition on a translucent substrate 3 by using an electrostatic coating apparatus having an electrostatic spray gun having a rotary atomizing head, followed by firing, has an antiglare performance. When the boiling point is at least the lower limit value in the above range, after liquid droplets of the coating composition are deposited on the transparent substrate 3, an uneven structure can be formed while sufficiently maintaining the droplet shape.

Since water is necessary for hydrolysis of an alkoxysilane, etc. in the silica precursor (A), the liquid medium (B) contains at least water as a liquid medium (B1), unless substitution of the liquid medium is conducted after the hydrolysis. The liquid medium (B) may further contain a liquid other than a liquid medium (B1), i.e. a liquid medium having a boiling point exceeding 150° C., as the case requires.

(Particles (C))

The material for the particles (C) may, for example, be a metal oxide, a metal, a pigment, a resin, etc. The metal oxide may, for example, be $Al_2O_3$, $SiO_2$, $SnO_2$, $TiO_2$, $ZrO_2$, $ZnO$, $CeO_2$, Sb-containing $SnO_x$ (ATO), Sn-containing $In_2O_3$ (ITO), $RuO_2$, etc. In a case where the matrix of the antiglare film 5 is composed mainly of silica, $SiO_2$ is preferred, since the refractive index is equivalent to the matrix. The metal may, for example, be a simple metal (Ag, Ru, etc.), an alloy (AgPd, RuAu, etc.), etc. The pigment may, for example, be an inorganic pigment (titanium black, carbon black, etc.), an organic pigment, etc. The resin may, for example, be an acrylic resin, polystyrene, a melanin resin, etc.

The particles (C) may be solid particles, hollow particles, or perforated particles such as porous particles. "Solid" here means having no cavity inside. "Hollow" here means having a cavity inside. As the particles (C), one type may be used alone, or two or more types may be used in combination.

As the particles (C), silica particles of e.g. a spherical, scaly, rod-like or acicular shape are preferred, from such a viewpoint that it is thereby possible to suppress increase in the refractive index of the film and to reduce the reflectance. From such a viewpoint that it will be easy to obtain a lower haze factor, spherical silica particles are preferred. From such a viewpoint that anti-glare effects can be obtained with a small amount, or it is possible to suppress cracking or film peeling of the antiglare layer, scaly silica particles are preferred. "Scaly" here means a flat shape.

Spherical silica particles may be solid, hollow, or porous silica particles. One of these may be used alone, or two or more of them may be used in combination. The hollow silica particles may be ones having an outer shell made of silica ($SiO_2$) and a cavity inside of the outer shell.

The average particle diameter of the spherical silica particles is preferably from 10 to 300 nm, more preferably from 40 to 200 nm, further preferably from 70 to 110 nm. When the average particle size is at least the lower limit value in the above range, low sparkle properties will be more excellent. When the average particle size is at most the upper limit value in the above range, the haze factor becomes lower. Further, dispersion stability in the coating composition will be good.

The average particle diameter of the spherical silica particles means a volume-based cumulative 50% diameter (D50), i.e. a particle diameter at a point of 50% in the cumulative volume distribution curve wherein the total volume of the particle size distribution obtained by volume is set to be 100%. The particle size distribution is obtainable by the frequency distribution and cumulative volume distribution curve measured by a laser diffraction/scattering particle size distribution analyzer.

Scaly silica particles are flaky or silica secondary particles formed by a plurality of flaky silica primary particles laminated one another with their surfaces oriented in parallel. The silica secondary particles usually have a particle form of a laminated structure. The scaly silica particles may be only either one of silica primary particles and silica secondary particles, or may be both of them.

The thickness of the silica primary particles is preferably from 0.001 to 0.1 µm. When said thickness is within the above range, they may be laminated one another with their surfaces oriented in parallel to form one or more scaly silica secondary particles. The ratio of the minimum length to the thickness of the silica primary particles is preferably at least 2, more preferably at least 5, further preferably at least 10.

The thickness of the silica secondary particles is preferably from 0.001 to 3 µm, more preferably from 0.005 to 2 µm. The ratio of the minimum length to the thickness of the silica secondary particles is at least 2, more preferably at least 5, further preferably at least 10. The silica secondary particles are preferably present independently of one another without being fused.

The average aspect ratio of the scaly silica particles is preferably from 30 to 200, more preferably from 40 to 160, further preferably from 50 to 120. When the average aspect ratio is at least the lower limit value in the above range, it is possible to sufficiently suppress cracking or film peeling of the antiglare layer even if the film thickness is thick. When the average aspect ratio is at most the upper limit value in the above range, dispersion stability in the coating composition will be good.

The "aspect ratio" means a ratio of the maximum length to the thickness of a particle (maximum length/thickness), and the "average aspect ratio" is an average value of aspect ratios of randomly selected 50 particles. The thickness of a particle is measured by an atomic force microscope (AFM), and the maximum length is measured by a transmission electron microscope (TEM).

The average particle diameter of the scaly silica particles is preferably from 50 to 500 nm, more preferably from 100 to 300 nm. When the average particle diameter is at least the lower limit value in the above range, low sparkle properties will be more excellent. Further, it is possible to sufficiently suppress cracking or film peeling of the antiglare layer even if the film thickness is thick. When the average particle diameter is at most the upper limit value in the above range, the haze factor becomes lower. Further, dispersion stability in the coating composition will be good.

The average particle diameter of the spherical silica particles is measured in the same manner as the average particle diameter of the scaly silica particles.

In the powder or dispersion, not only scaly silica particles, but also irregular silica particles formed during the production of the scaly silica particles may sometimes be contained. Scaly silica particles are obtained, for example, by disintegrating and dispersing aggregate-shaped silica tertiary particles (hereinafter referred to also as silica aggregates) having gaps, formed by aggregation and irregular lamination of scaly silica particles. Irregular silica particles are in such a state that silica aggregates are disintegrated to some extent, but not disintegrated to individual scaly silica particles, and in a form wherein a plurality of scaly silica particles are forming lumps. If irregular silica particles are contained, the density of the antiglare layer to be formed may be lowered, whereby cracking or film peeling will be likely to occur. Therefore, the content of irregular silica particles in the powder or dispersion should better be small.

Irregular silica particles and silica aggregates are both observed to be black by the TEM observation. On the other hand, flaky silica primary particles or secondary silica particles are observed to be pale black or semitransparent by the TEM observation.

As scaly silica particles, commercially available ones may be used, or ones produced may be used.

Commercial products of scaly silica particles may, for example, be SUNLOVELY (registered trademark) series manufactured by AGC Si-Tech Co., Ltd.

(Binder (D))

As a binder (D) (but excluding the silica precursor (A)), an inorganic material or resin to be dissolved or dispersed in a liquid medium (B) may be mentioned. The inorganic material may, for example, be a metal oxide precursor other than silica (metal: titanium, zirconium, etc.). The resin may, for example, be a thermoplastic resin, a thermosetting resin, an ultraviolet-curable resin, etc.

(Additives (E))

Additives (E) may, for example, be an organic compound (E1) having a polar group, an ultraviolet absorber, an infrared reflection/infrared absorbing agent, an antireflection agent, a surfactant to improve leveling properties, a metal compound to improve durability, etc.

In a case where the coating composition contains particles (C), by incorporating an organic compound (E1) having a polar group into the coating composition, it is possible to prevent aggregation of the particles (C) by the electrostatic force in the coating composition.

The organic compound (E1) having a polar group may, for example, be an unsaturated carboxylic acid polymer, a cellulose derivative, an organic acid (but excluding an unsaturated carboxylic acid polymer), a terpene compound, etc. As the organic compound (E1), one type may be used alone, or two or more types may be used in combination.

The surfactant to improve leveling properties may, for example, be a silicone oil-type, acrylic type, etc. The metal compound to improve durability may, for example, be preferably a zirconium chelate compound, a titanium chelate compound, an aluminum chelate compound, etc. The zirconium chelate compound may, for example, be zirconium tetraacetylacetonate, zirconium tributoxystearate, etc.

(Composition)

The total content of the silica precursor (A) and particles (C) in the coating composition is preferably from 30 to 100 mass %, more preferably from 40 to 100 mass %, in the solid content (100 mass %) in the coating composition (provided that the silica precursor (A) is calculated as $SiO_2$). When the total content is at least the lower limit value in the above range, adhesion to the translucent substrate 3 will be excellent. When the total content is at most the upper limit value in the above range, cracking or film peeling of the antiglare layer 5 will be prevented.

The solid content in the coating composition is a total of contents of all components other than the liquid medium (B), in the coating composition. However, the content of the silica precursor (A) is one calculated as $SiO_2$.

In a case where the particles (C) are spherical silica particles, the ratio of the particles (C) to the total mass (100 mass %) of the silica precursor (A) and the particles (C) is preferably from 3 to 30 mass %, more preferably from 5 to 20 mass %.

In a case where the particles (C) are scaly silica particles, the ratio of the particles (C) to the total mass (100 mass %) of the silica precursor (A) and the particles (C) is preferably from 0.5 to 20 mass %, more preferably from 1 to 15 mass %.

When the ratio of the particles (C) is at least the lower limit value in the above range, low sparkle properties will be more excellent. When the ratio of the particles (C) is at most the upper limit value in the above range, a lower haze factor is easily obtainable. Further, by incorporating the silica precursor (A) in a ratio of at least a predetermined level, the adhesion strength between the anti-glare layer 5 and the translucent substrate 3 will be more excellent.

The content of the liquid medium (B) in the coating composition is an amount depending on a solid content concentration in the coating composition. The solid content concentration in the coating composition is, based on the total amount (100 mass %) of the coating composition, preferably from 0.05 to 2 mass %, more preferably from 0.1 to 1 mass %. When the solid content concentration is at least the lower limit value in the above range, it is possible to reduce the liquid amount of the coating composition. When the solid content concentration is at most the upper limit value in the above range, it will be easy to form an uneven structure having second convex portions. Further, the uniformity of the film thickness of the antiglare layer will be improved.

The content of the liquid medium (B1) with a boiling point of at most 150° C. in the coating composition is usually at least 86 mass % based on the total amount of the liquid medium (B). By incorporating the liquid medium (B1) in a proportion of at least 86 mass %, when the coating composition is applied onto the translucent substrate by using an electrostatic coating apparatus comprising an electrostatic spray gun having a rotary atomizing head, followed by firing, an antiglare layer will be formed. When the proportion of the liquid medium (B1) is less than 86 mass %, an uneven structure cannot be formed since smoothing takes place before volatilization of the solvent, whereby there is a possibility that the film after firing does not become an antiglare layer.

The content of the liquid medium (B1) is preferably at least 90 mass % based on the total amount of the liquid medium (B). The content of the liquid medium (B1) may be even 100 mass % based on the total amount of the liquid medium (B).

(Viscosity)

The viscosity (hereinafter referred to also as "liquid viscosity") at the application temperature of the coating composition is preferably at most 0.003 Pa·s, particularly preferably from 0.001 to 0.003 Pa·s. When the liquid viscosity is at most the above upper limit value, liquid droplets to be formed at the time of spraying the coating composition becomes finer, and it will be easy to form an antiglare layer having a desired surface shape. When the liquid viscosity is at least the above lower limit value, the surface uneven shape of the antiglare layer will be uniform. The viscosity of the coating composition is a value measured by a B-type viscometer.

[Coating Step]

The application of the coating composition onto the translucent substrate may, for example, be conducted by using an electrostatic coating apparatus which has an electrostatic spray gun having a rotary atomizing head, by electrically charging and spraying the coating composition. At that time, it is preferred to adjust the atmosphere from the rotary atomizing head to the translucent substrate to be at least 20° C. and under a relative humidity of at most 40%, since the film properties of the antiglare film 5 will be thereby improved.

As the electrostatic coating apparatus, a known electrostatic coating apparatus may be used, so long as it is one which has an electrostatic spray gun having a rotary atomizing head. As the electrostatic spray gun, a known electrostatic spray gun may be used, so long as it is one which has a rotary atomizing head. However, the coating means for the coating composition is not limited to the above-described electrostatic coating apparatus, and a known coating means may be used.

[Firing Step]

In the firing step, a coating film of the coating composition formed on the translucent substrate in the coating step, is fired to become an antiglare layer. The firing may be carried out simultaneously with the application by heating the translucent substrate at the time of applying the coating composition to the transparent substrate, or may be carried out by heating the coating film after applying the coating composition to the translucent substrate. The firing temperature is preferably at least 30° C., and in a case where the translucent substrate is glass, it is more preferably from 100 to 750° C., further preferably from 150 to 550° C.

In the production method as described above, by heating the coating film after applying the predetermined coating composition to the translucent substrate, it is possible to form an antiglare layer 5 having a predetermined uneven structure on the surface.

Second Embodiment

Figure 4:
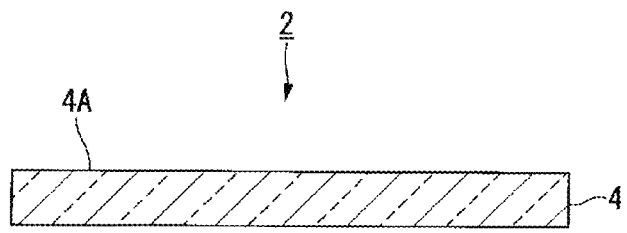
FIG. 4 is a schematic cross-sectional view showing a translucent structure in a second embodiment of the present invention.
Figure 5:
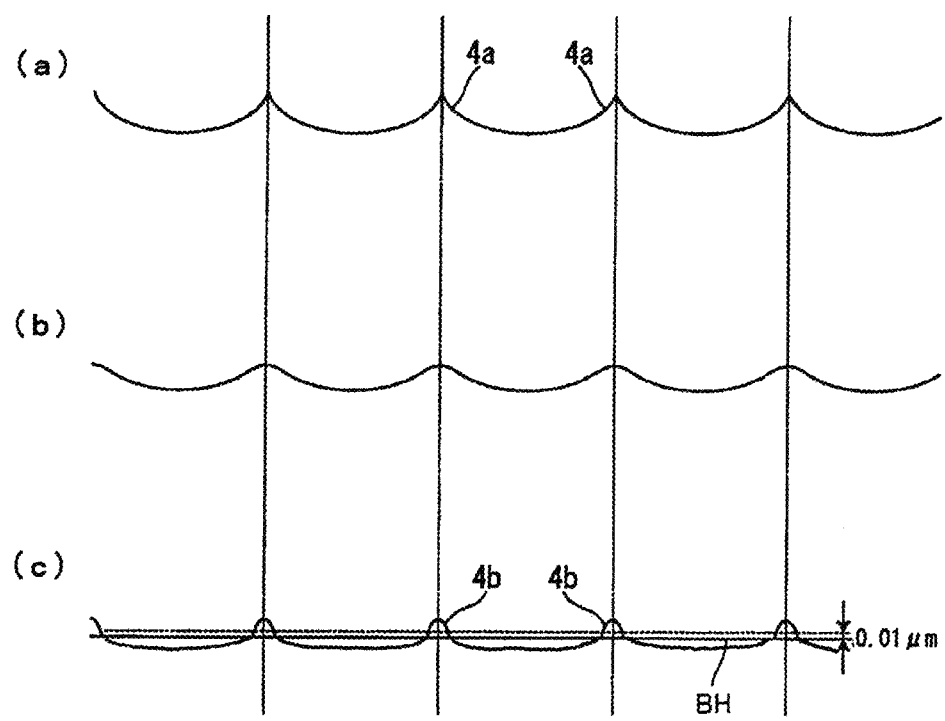
FIG. 5 is a view illustrating the relation of the surface shape of the translucent structure in the second embodiment, its smoothing image, and the image obtainable as the difference of their XYZ data.

FIG. 4 is a schematic cross-sectional view showing a translucent structure 2 in a second embodiment of the present invention. FIG. 5 is a view illustrating the relation of the surface shape of the translucent structure 2, its smoothing image, and the image obtainable as the difference of their XYZ data.

The translucent structure 2 of this embodiment comprises a translucent substrate 4. The translucent substrate 4 has an uneven structure at the first surface 4A. The first surface 4A of the translucent substrate 4 constitutes a surface of the translucent structure 2. Therefore, the translucent structure 2 has an uneven structure at the surface.

The translucent substrate 4 is, except that it has an uneven structure on the first surface, the same as the translucent substrate 3 in the first embodiment, and the preferred modes thereof are also the same.

As shown in FIG. 5(a), the uneven structure at the surface of the translucent substrate 4 (i.e. at the surface of the translucent structure 2), includes first convex portions 4a, of which the diameters (calculated as true circles) at a height of the bearing height+0.05 μm in the surface shape of the translucent substrate 4 (i.e. in the surface shape of the translucent structure 2) are at least 1 μm. First convex portions 4a are present in a plurality, and by the plurality of first convex portions 4a, undulation is formed at the surface of the translucent substrate 4.

Further, in the surface shape of the translucent substrate 4, when filtering the surface shape by image processing software SPIP (manufactured by Image Metrology) to obtain a smoothing image as shown in FIG. 5(b), and subtracting XYZ data of the smoothing image from XYZ data of the surface shape, an image having a plurality of convex portions scattered on a plane as shown in FIG. 5(c) is obtainable. In this image having a plurality of convex portions scattered on a plane, the plurality of convex portions include second convex portions 4b, of which the diameters (calculated as true circles) at a height 0.01 μm is at least 0.4 μm. The second convex portions 4b are present in a plurality.

In this embodiment, top portions of the first convex portions 4a having substantially triangular cross sections are detected as the second convex portions 4b. Therefore, as shown by chain lines in FIG. 5, the positions of the top portions of the first convex portions 4a and the positions of the top portions of the second convex portions 4b are substantially matched. The measurements and analysis of the surface shape are carried out in the same manner as in the first embodiment.

The respective properties (average diameter, density, area ratio, etc.) of the first convex portions 4a and the second convex portions 4b are the same as of the first convex portions 5a and the second convex portions 5b in the first embodiment, and the preferred modes are also the same. The respective preferred ranges of the haze factor, the 60° specular gloss at the surface having the uneven structure, the glare index value S and the pencil hardness, of the translucent structure 2, are the same as in the first embodiment.

The translucent structure 2 has a specific uneven structure at the surface, whereby like the above-described translucent structure 1, it has an antiglare property and also has a low haze factor and a low sparkle property.

<Method for Producing Translucent Structure>

The translucent structure 2 may, for example, be produced by subjecting the surface of a translucent substrate having no uneven structure to etching treatment to form an uneven structure.

The etching treatment can be carried out by using various known etching methods depending upon the material for the translucent substrate, the required haze factor, etc. For example, in a case where the translucent substrate is a glass substrate, the etching method may be a method of contacting a fluorinating agent to the surface of the glass substrate. When contacting the fluorinating agent, at the glass surface, the fluorinating agent will react with $SiO_2$ being a skeletal structure of the glass to form $SiF_4$ (gas), and the remaining component having the skeletal structure lost, becomes to be silicon fluoride, whereby the glass surface becomes to be uneven. The fluorinating agent may, for example, be simple fluorine ($F_2$), hydrogen fluoride (HF), etc. In this method, the shape of unevenness to be formed can be adjusted by the type of the fluorinating agent to be used, the time for contacting the fluorinating agent to the glass surface, the etching temperature, etc. For example, in a case where etching treatment is carried out with a treating liquid containing a fluorinating agent and particles (glass beads, etc.), it is possible to change the shape of unevenness by changing the content of the particles in the treating liquid. For example, if the content of the particles in the treating liquid is increased, etching by the fluorinating agent will be inhibited, whereby the etching amount will be reduced, and, as a result, unevenness to be formed by the etching treatment will be reduced, and the haze factor will be lowered.

As an etching method for a glass substrate, other than contacting a fluorinating agent, or as an etching method which can be applied to a case of a translucent substrate of a material other than glass, for example, blasting treatment, ion etching treatment, etc. may be mentioned.

Etching treatment may be carried out twice or more times under different treating conditions, respectively. For example, first convex portions 4a may be formed by first etching treatment, and a second convex portions 4b may be formed by second etching treatment. In this case, the etching speed in the second etching treatment is desired to be faster than the etching speed in the first etching treatment.

In the case of carrying out etching by using the above-mentioned treating liquid, the content of particles in the treating liquid may be changed between the first time and the second time. For example, when the content of particles in the treating liquid to be used in the second time is made to be less than in the first time, irregularities formed by the first etching treatment will be smoothed at the time of the second etching treatment.

Third Embodiment

Figure 6:
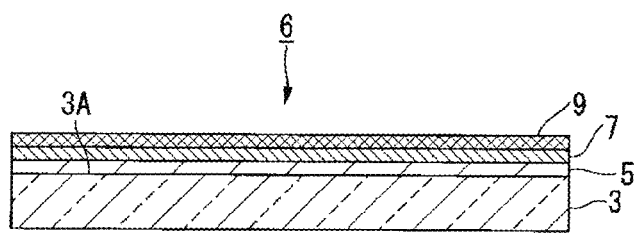
FIG. 6 is a cross-sectional view schematically showing a translucent structure in a third embodiment of the present invention.
Figure 7:
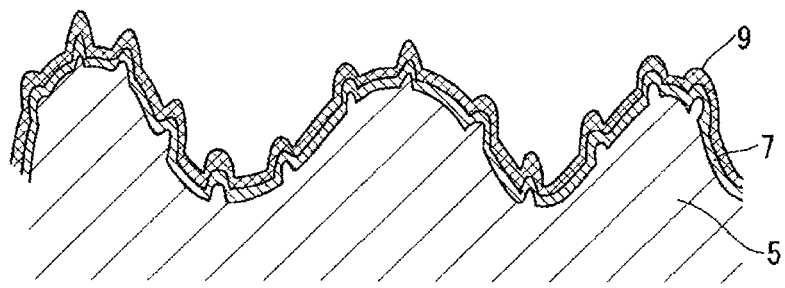
FIG. 7 is a cross-sectional view schematically illustrating the structure near the surface of the translucent structure in the third embodiment.

FIG. 6 is a cross-sectional view schematically showing a translucent structure 6 in a third embodiment of the present invention. FIG. 7 is a cross-sectional view schematically illustrating the structure near the surface of the translucent structure 6. In the embodiments to be described below, constituting elements corresponding to those in the foregoing embodiments will be identified with the same reference symbols and their detailed description will be omitted.

The translucent structure 6 of this embodiment comprises a translucent substrate 3, an antiglare layer 5 formed on the first surface 3A of the translucent substrate 3, an antireflection layer 7 (functional layer) formed on the antiglare layer 5, a water/oil-repellent layer 9 (functional layer) formed on the antireflection layer 7. Each of the antireflection layer 7 and the water/oil-repellent layer 9 has an uneven structure at the surface, like the antiglare layer 5.

The surface of the water/oil-repellent layer 9 constitutes the surface of the transparent structure 6. Therefore, the translucent structure 6 has an uneven structure at the surface. In FIG. 6, the ratio in thickness of each of the antiglare layer 5, the antireflection layer 7 and the water/oil repellent layer 9, to the thickness of the translucent substrate 3, is made to be larger than the actual ratio for convenience sake.

(Antireflection Layer)

The antireflection layer 7 has a function to reduce reflectance. By having an antireflection layer 7, as compared with the case of having no antireflection layer 7, the reflectance of the translucent structure 6 will be low.

The antireflection layer 7 may, for example, be the following (1) or (2).

(1) An antireflection layer with a multilayer structure wherein a low refractive index layer having a relatively low refractive index and a high refractive index layer having a relatively high refractive index are alternately laminated.

(2) An antireflection layer made of a low refractive index layer having a refractive index lower than the translucent substrate 3.

The material for the antireflection layer of the above (1) is not particularly limited, and various materials can be used as long as they are materials capable of suppressing reflection of light.

A construction may be such that one layer of each of the high refractive index layer and the low refractive index layer is contained, or such that two or more layers of each of them are contained. When two or more layers of each of the high refractive index layer and the low refractive index layer are contained, the construction is preferably such that the high refractive index layer and the low refractive index layer are alternately stacked.

Particularly, in order to enhance the antireflection performance, the antireflection layer of (1) is preferably a stacking having multiple layers stacked, and, for example, the stacking is preferably one having at least two and at most six layers in total stacked.

The materials for the high refractive index layer and the low refractive index layer are not particularly limited and can be selected in consideration of the required degree of antireflection, the productivity, etc. As the material to constitute the high refractive index layer, it is possible to preferably use, for example, at least one member selected from the group consisting of niobium oxide ($Nb_2O_5$), titanium oxide ($TiO_2$), zirconium oxide ($ZrO_2$), silicon nitride (SiN) and tantalum oxide ($Ta_2O_5$). As the material to constitute the low refractive index layer, silicon oxide ($SiO_2$) can be preferably used.

As the high refractive index layer, from the productivity and the degree of the refractive index, it is more preferred that the high refractive index layer is made of any one selected from a niobium oxide layer, a tantalum oxide layer and a titanium oxide layer, and the low refractive index layer is a silicon oxide layer.

In the antireflection layer of (2), the refractive index of the low refractive index layer is set depending upon the refractive index of the translucent substrate 3. For example, in a case where the translucent substrate 3 is glass, the refractive index of the low refractive index layer is preferably from 1.1 to 1.5, more preferably from 1.1 to 1.3. The antireflection layer of (2) may, for example, be a silica-type porous film having pores in a matrix composed mainly of silica.

The silica-type porous film may, for example, be one comprising a matrix and hollow particles having pores inside the particles. The thickness of the antireflection layer of the above (2) is preferably from 50 to 300 nm, more preferably from 80 to 160 nm.

The refractive index of the layer (such as the low refractive index layer, the high refractive index layer, etc.) is measured by e.g. an ellipsometer or a spectrophotometer. The thickness of the layer (such as the low refractive index layer, the high refractive index layer, the antireflection layer, etc.) is measured by e.g. a spectrophotometer or a contact-type film thickness meter.

The uneven structure at the surface of the antireflection layer 7 is similar to the uneven structure at the surface of the antiglare layer 5, and the preferred modes thereof are also the same. The uneven structure at the surface of the antireflection layer 7 is, as shown in FIG. 7, preferably to follow the unevenness at the surface of the antiglare layer 5. In such a case, the uneven structure at the surface of the antireflection layer 7 may be such that, as compared with the uneven structure at the surface of the antiglare layer 5, corners and height differences may be less. For example, the area ratio of the second convex portions of the antireflection layer 7 may have higher than the area ratio of the second convex portions of the antiglare layer 5.

(Water/Oil-Repellent Layer)

The water/oil-repellent layer 9 is a layer having water/oil repellency. As the water/oil-repellent layer 9 is present as the outermost surface layer on the viewing side of the translucent structure, the finger sliding property will be good.

"Having water/oil repellency" means that the contact angle of water is at least 90°, and the contact angle of oleic acid is at least 70°. The contact angle is measured by using a contact angle meter (e.g. DM-701 manufactured by Kyowa Interface Science Co., Ltd.), with respect to a liquid droplet of 1 µL under a condition in a range of 20±10° C. It is measured at five different locations at the surface of the water/oil-repellent layer, then, an average value thereof is calculated, and the value is adopted as the contact angle of the water/oil repellent layer. As the water/oil-repellent layer 9, an AFP (Anti Finger Print) layer, etc. may be mentioned.

The material for forming a water/oil-repellent layer 9 may, for example, be a perfluoroalkyl group-containing compound, a perfluoropolyether group-containing compound, etc., and a silane compound having a perfluoropolyether group is preferred.

As the material for the water/oil-repellent layer 9, it is possible to use, for example, commercially available "Afluid S-550" (registered trademark of Asahi Glass Company, Limited), "KP-801" (trade name, Shin-Etsu Chemical Co., Ltd.), "X-71" (trade name, Shin-Etsu Chemical Co., Ltd.), "KY-130" (trade name, Shin-Etsu Chemical Co., Ltd.), "KY-178" (trade name, Shin-Etsu Chemical Co., Ltd.), "KY-185" (trade name, Shin-Etsu Chemical Co., Ltd.), "Optool DSX (trade name, Daikin Industries, Ltd.), etc.

The thickness of the water/oil-repellent layer 9 is preferably from 1 to 50 nm, more preferably from 3 to 25 nm, particularly preferably from 4 to 15 nm. When the thickness is at least the above lower limit value, sufficient water/oil repellency will be exhibited, and the finger sliding property on the surface of the water/oil-repellent layer 9 will be good. When the thickness is at most the above upper limit value, utilization efficiency of the water/oil repellent will be high, and influence on antireflective properties is less, such being preferred, but it is useful even if thicker than this.

The thickness of the water/oil-repellent layer 9 can be calculated from the vibration period of an interference pattern of reflected X-ray obtained by an X-ray reflectance method using, for example, an X-ray diffractometer for thin film analysis ATX-G (Rigaku Corporation). Otherwise, an antireflection film having its reflection spectrum measured in advance, is prepared, and a water/oil-repellent layer 9 is formed thereon under the same conditions as a sample for measuring the thickness of the water/oil-repellent layer 9, whereupon the thickness is calculated from the reflection spectrum and the refractive index of the water/oil repellent.

The uneven structure at the surface of the water/oil-repellent layer 9 is similar to the uneven structure at the surface of the antiglare layer 5, and the preferred modes thereof are also the same. It is preferred that the uneven structure at the surface of the water/oil-repellent layer 9 follows the unevenness at the surface of the antiglare layer 5 and the antireflection layer 7, as shown in FIG. 7.

In the translucent structure 6, even when functional layers (antireflection layer 7 and water/oil-repellent layer 9) are provided on the antiglare layer 5, the sparkle suppressing effect is determined by an uneven shape of the outermost surface, and therefore, so long as the uneven shape of the layer at the outermost surface is in the predetermined uneven shape having the sparkle suppressing effect in this embodiment, the translucent structure 6 will exhibit the sparkle suppressing effect.

The respective preferred ranges of the haze factor, the 60° specular gloss at the surface having the uneven structure, the sparkle index value S, the half-value width of the projection distribution and the pencil hardness, of the translucent structure 6, are the same as in the first embodiment.

The translucent structure 6 has a specific uneven structure on the surface, and therefore, like the above-described translucent structure 1, it has an antiglare property and also has a low haze factor and a low sparkle property.

Further, since it has the antireflection layer 7 on the viewing side of the translucent substrate 3, it has excellent antireflection properties. Further, since it has a water/oil-repellent layer 9 at the outermost layer, the finger sliding property is good. The finger sliding property being good is preferred from the viewpoint of, for example, operation efficiency of a touch panel.

<Method for Producing Translucent Structure>

The translucent structure 6 can be produced, for example, by forming the antiglare layer 5 on the first surface 3A of the translucent substrate 3 by the method mentioned in the first embodiment, and then carrying out a step (antireflection layer forming step) of forming an antireflection layer 7 on this antiglare layer 5, and a step (water/oil-repellent layer forming step) of treating the surface of the antireflection layer 7 with a water/oil-repellent to form a water/oil-repellent layer 9.

[Antireflection Layer Forming Step]

Since the surface of the antiglare layer 5 has the above-described uneven structure, by forming the antireflection layer 7 along the surface shape of the antiglare layer 5 in the antireflection layer forming step, it is possible to form the antireflection layer 7 having the uneven structure on the surface.

The method for forming the antireflection layer 7 is not particularly limited, and a known method such as a dry method or a wet method, may be used. As the dry method, a sputtering method, a vacuum vapor deposition method, an ion plating method, a chemical vapor growing method, etc. may be mentioned. For example, by conducting sputtering in an oxygen atmosphere by using a metal (Si, Nb, etc.) as the target, a layer of a metal oxide will be formed.

As the method for forming the antireflection layer 7, from the viewpoint of antireflection properties, a dry method is preferred, and particularly, a sputtering method is more preferred from the viewpoint of productivity.

[Water/Oil-Repellent Layer Forming Step]

The method for treatment with a water/oil-repellent (method for forming a water/oil-repellent layer 9) may, for example, be a wet coating method such as a spray coating method, a dip coating method, a squeegee coating method, a wipe coating method or a flow coating method; a dry coating method such as a vapor deposition method; etc. As the method for forming the water/oil-repellent layer 9, either one of the wet coating method and the dry coating method, may be used.

Fourth Embodiment

Figure 8:
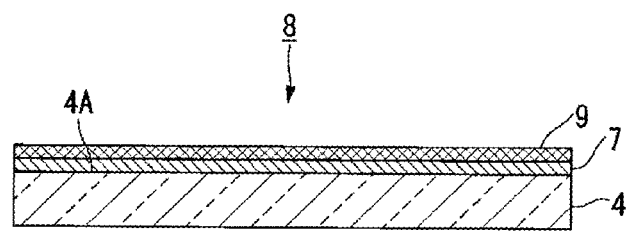
FIG. 8 is a cross-sectional view schematically showing a translucent structure in a fourth embodiment of the present invention.

FIG. 8 is a cross-sectional view schematically showing a translucent structure 8 in a fourth embodiment of the present invention.

The translucent structure 8 of this embodiment comprises a translucent substrate 4, an antireflection layer 7 formed on the first surface 4A of the translucent substrate 4, and a water/oil-repellent layer 9 formed on the antireflection layer 7. Each of the translucent substrate 4, the antireflection layer 7 and the water/oil-repellent layer 9 has an uneven structure at the surface. The surface of the water/oil-repellent layer 9 constitutes the surface of the translucent structure 8. Therefore, the translucent structure 8 has the uneven structure at the surface.

It is preferred that the unevenness of each of the antireflection layer 7 and the water/oil repellent layer 9 follows the unevenness of the first surface 4A of the translucent substrate 4. In FIG. 8, the ratio of the thickness of each of the antireflection layer 7 and the water/oil repellent layer 9 to the thickness of the translucent substrate 4, is made larger than the actual ratio for convenience sake.

In the translucent structure 8, even when the antireflective layer 7 and the water/oil-repellent layer 9 are provided on the uneven structure at the surface of the translucent substrate 4, the sparkle suppressing effect is determined by an uneven shape at the outermost surface, and therefore, so long as the uneven shape of the layer at the outermost surface, is in the predetermined uneven shape having the sparkle suppressing effect in this embodiment, the translucent structure 8 will exhibit the sparkle suppressing effect.

The respective preferred ranges of the haze factor, the 60° specular gloss at the surface having the uneven structure, the sparkle index value S, the half-value width of the projection distribution and the pencil hardness, of the translucent structure 8, are the same as in the first embodiment.

The translucent structure 8 has a specific uneven structure at the surface, and therefore, like the above described translucent structure 2, it has an antiglare property and also has a low haze factor and a low sparkle property.

Further, since it has the antireflection layer 7 on the viewing side of the translucent substrate 4, it has excellent antireflection properties. Further, since it has a water/oil-repellent layer 9 as the outermost layer, the finger sliding property is good.

<Method for Producing Translucent Structure>

The translucent structure 8 can be prepared, for example, by producing a translucent substrate 4 by the production method mentioned in the second embodiment, and then, carrying out a step (antireflection layer forming step) of forming an antireflection layer 7 on the first surface 4A of this translucent substrate 4, and a step (water/oil repellent layer forming step) of treating the surface of this antireflection layer 7 with a water/oil-repellent to form a water/oil repellent layer 9.

The antireflection layer forming step and the water/oil-repellent layer forming step may, respectively, be carried out in the same manner as in the third embodiment.

In the foregoing, the translucent structure of the present invention has been described with reference to the first to fourth embodiments, but the present invention is not limited to these embodiments. The respective constructions in the above embodiments and their combinations are merely exemplary, and additions, omissions, substitutions and other modifications of the constructions are possible without departing from the concept of the present invention.

For example, in the first and third embodiments, an example has been shown wherein the antiglare layer 5 is provided only on one side (on the first surface 3A) of the translucent substrate 3, but the antiglare layer 5 may be provided on both sides of the translucent substrate 3. Further, the antiglare layer 5 may be provided at the entire surface or a part of the surface on one or both sides of the translucent substrate 3.

In the second and fourth embodiments, an example has been shown wherein the uneven structure is provided only on one side (on the first surface 4A) of the translucent substrate 4, but the uneven structure may be provided on both sides of the translucent substrate 4. Further, the uneven structure may be provided at the entire surface or a part of the surface on one or both sides of the translucent substrate 4.

The translucent structures in the first and third embodiments may be modified to have a construction having another functional layer between the transparent substrate 3 and the antiglare layer 5. Another functional layer may, for example, be an undercoat layer, an adhesion improving layer, a protective layer, etc. The undercoat layer has a function as an alkali-barrier layer or a wide band low refractive index layer. As the undercoat layer, preferred is a layer formed by applying a coating composition for an under coating, containing an alkoxysilane hydrolyzate (sol-gel silica), on the main body of the translucent substrate.

The translucent structures in the third and fourth embodiments may be modified to have a construction having no antireflection layer 7 or no water/oil-repellent layer 9. The translucent structures in the third and fourth embodiments may be modified to have a construction having another functional layer between the antiglare layer 5 and the antireflection layer 7, or between the antireflection layer and the water/oil repellent layer 9.

As an application of the translucent structure of the present invention, an image display device is preferred, from the viewpoint of the optical characteristics such as a low haze factor, low sparkle properties, etc. However, the application of the translucent structure of the present invention is not limited to an image display device, and it may be used for various applications.

Specific examples for the application of the translucent structure of the present invention include vehicle transparent components (headlight covers, etc.), transparent components for vehicles (instrument panel surfaces, etc.), meters, architectural windows, show windows, displays (notebook computers, monitors, LCD, PDP, ELD, CRT, PDA, etc.), LCD color filters, substrates for touch panels, camera parts, projector parts, transparent substrates for solar cells (cover glass, etc.), mobile phone windows, backlight unit parts LCD brightness enhancement films (prisms, semi-transmissive films, etc.), liquid crystal brightness-improving films, organic EL light emitting device components, inorganic EL light emitting device components, phosphor light emitting device components, optical filters, end surfaces of optical components, illumination lamps, covers of lighting instruments, polarizing films, agricultural films, etc.

EXAMPLES

Hereinafter, the present invention will be described specifically with reference to Examples. However, the present invention is not limited by the following description. In the following, "mass %" may also be referred to as "wt %". Ex. 1 to 33 described later are Examples of the present invention, and Ex. 34 to 39 are Comparative Examples. The evaluation methods and materials used in each Ex. are shown below.

[Evaluation Methods]
(Measurement of Surface Shape)

The surface shape of a surface having an uneven structure of a translucent structure was measured by using laser microscope VK-X100 manufactured by Keyence Corporation. As the objective lens, "×100" was used (observation region: 109×145 μm, magnification: 1,000 times). Measurement mode was set to be "surface shape", and measurement quality was set to be "high-definition" (X dot interval: 71 nm, Y dot interval: 71 nm, Z dot interval: 10 nm). X dot interval, Y dot interval and Z dot interval represent the measurement interval values in X direction, Y direction and Z direction, respectively.

(Analysis of Surface Shape)

XYZ data of the surface shape obtained by the measurement of the surface shape were analyzed by using image processing software SPIP (version 0.6.4.3) manufactured by Image Metrology, to obtain the respective characteristics of first convex portions and second convex portions (Z range, the number, density, area ratio, maximum diameter, minimum diameter, average diameter, maximum height, minimum height and average height in the observation region). In the analysis, by setting the parameters as follows, flattening treatment, measurement of first convex portions and measurement of second convex portions were carried out.

(1) Flattening Treatment
1. Mode value (mode): The custom mode is selected.
2. The tertiary average profile fit method is selected.
3. "Step treatment" function is not used.
4. Z offset method: The bearing height is set to be zero.
(2) Measurement of first convex portions (undulation)
<(2)-1: Detection>
1. "Particle detection" is selected.
2. Threshold level: 0.05 μm.
<(2)-2: Post Treatment>
3. "Detection image window" selection.
4. "Save whole of shape" is selected.
5. Smoothing the shape contour: filter size: 51 points.
6. "Including the shape of the image end" is selected.
7. Minimum diameter: 1 μm.
(3) Measurement of Second Convex Portions (Islands)
<(3)-1: Filtering>
1. "Convolution" selection.
2. "Smoothing" selection.
3. Kernel size: X=Y=31, "circular" is selected.
<(3)-2: Detection>
4. Detection image: "Filtering difference" is selected.
5. "Particle detection" is selected.
6. Threshold level: 0.01 μm.
<(3)-3: Post Treatment>
7. Measurement of the image window: "Filtering difference" is selected.
8. "Save whole of shape" is selected.
9. Smoothing the shape contour: filter size: 51 points.
10. "Including the shape of the image end" is used.
11. Minimum diameter: 0.4 μm.

In the measurement of the first convex portions, the difference in height between the highest position and the lowest position in the observation region was set to be Z range. The density of the first convex portions was calculated by converting the number of the first convex portions in the observation region to the value per 1 μm$^2$. The area ratio of the first convex portions was obtained by calculating the total area of cross sections of the convex portions, of which the diameters (calculated as true circles) existing at a height of the bearing height+0.05 µm, are at least 1 µm, and calculating the proportion of this total area in the observation region. The maximum diameter, the minimum diameter and the average diameter, of the first convex portions, are, respectively, the values measured at "a height of the bearing height+0.05 µm". The maximum height, the minimum height and the average height, of the first convex portions, are, respectively, the maximum value, the minimum value and the average value measured in the observation region, among heights (heights from the bearing height) of the first convex portions.

In the measurement of the second convex portions, in an image (an image wherein a plurality of convex portions are scattered) obtainable as a difference between XYZ data of the surface shape and XYZ data of a smoothing image obtained by filtering the surface shape, a difference between the highest height and the lowest height was adopted as the Z range of the second convex portions. The density of the second convex portions was calculated by converting the number of the second convex portions in the observation region to a value per 1 µm². The area ratio of the second convex portions was obtained by calculating, in an image obtainable as a difference between XYZ data of the surface shape and XYZ data of a smoothing image obtained by filtering the surface shape, the total area of cross sections of convex portions, of which the diameters (calculated as true circles) present at a height of 0.01 µm when the bearing height is deemed to be 0, are at least 0.4 µm and calculating the proportion of this total area in the observation region. The maximum diameter, the minimum diameter and the average diameter, of the second convex portions, are, respectively, the values measured at a height of 0.01 µm of the above image. The maximum height, the minimum height and the average height, of the second convex portions, are, respectively, measured from the zero height of the above image (the position of the bearing height plane).

(Diffusion (Antiglare Index Value D))

The measurement of Diffusion was carried out according to the following procedure by using goniophotometer GC5000L manufactured by Nippon Denshoku Industries Co., Ltd.

From the first surface side of the translucent structure, the first light is irradiated in a direction at an angle θ=−45°±0.5° (hereinafter referred to also as an "angle −45° direction") when a direction parallel to the thickness direction of the translucent structure is deemed to be an angle θ=0°. The first light is reflected on the translucent structure. By receiving 45° reflected light reflected in a direction at an angle of 45° from the first surface, the intensity of the reflected light is measured and adopted as the "luminance of 45° reflected light".

Then, the same operation is carried out by changing the angle θ for receiving light emitted from the first surface in a range of from 5° to 85°. Thus, the luminance distribution of light passing through the translucent structure and emitted from the second surface is measured and totaled to obtain the "luminance of total reflected light".

Then, Diffusion (antiglare index value D) is calculated from the following formula (1).

Diffusion(antiglare index value $D$)={(luminance of total reflected light−luminance of 45° reflected light)/(luminance of total reflected light)} (1)

This Diffusion is confirmed to correlate with the results of judgement of the antiglare property by visual observation of a viewer, and to show the behavior close to the visual sense of human. For example, a translucent structure showing a small (close to zero) value of the antiglare index value D is inferior in the antiglare property, and in contrast, a translucent structure showing a large value of the antiglare index value D has a good antiglare property. Accordingly, this antiglare index value D can be used as a quantitative index at the time of judging the antiglare property of a translucent structure.

(Sparkle Measurement)

Based on the sparkle index value S obtained according to the above-described measuring method, sparkle was evaluated by the following standards.

⊚: Sparkle index S is at most 25 (level where no sparkle is observed at all).

◎: Sparkle index S is more than 25 and at most 30 (level where sparkle is slightly observed).

○: Sparkle index S is more than 30 and at most 37 (level where sparkle is observed, but there is no practical problem).

×: Sparkle index S exceeds 37 (remarkable sparkle is observed).

(Half-Value Width of Projection Distribution)

By using the above-mentioned laser microscope at a magnification of 1,000 times, scanning was conducted for a region of 109 µm×145 µm of the surface having an uneven structure of a translucent structure, to obtain a surface profile. From the obtained surface profile, by Histogram Plot, a projection distribution obtained by plotting the projection height (unit: nm) on the horizontal axis and the frequency on the vertical axis (unit: Counts) was obtained.

Of the obtained projection distribution, the width of the projection distribution at a position of the half height of the peak height was adopted as the half-value width (unit: nm).

[Materials]

(Dispersions of Particles)

ST-OZL: Snowtex OZL, manufactured by Nissan Chemical Industries, Ltd., dispersion of spherical solid silica particles, dispersion medium: water, particle size: from 70 to 100 nm.

SLV: dispersion of scaly silica particles having SUN-LOVELY LFS HN150 (manufactured by AGC Si-Tech Co., Ltd.) crushed and dispersed, dispersion medium: water, average particle size: 185 nm, average aspect ratio (average particle diameter/average thickness): 80.

ST-OL: SNOWTEX OL (manufactured by Nissan Chemical Industries, Ltd.), dispersion of spherical solid silica particles, dispersion medium: water, particle size: from 40 to 50 nm.

ST-O: SNOWTEX O (manufactured by Nissan Chemical Industries, Ltd.), dispersion of spherical solid silica particles, dispersion medium: water, average particle size: from 10 to 15 nm.

(Particle-Containing Silica Precursor Solution)

A particle-containing silica precursor solution was prepared by the following procedure.

Liquid A: Using Sol mix AP-11 (trade name, manufactured by Japan Alcohol Trading Co., Ltd.) as a main solvent, while stirring AP-11 by means of a magnetic stirrer, pure water, tetraethoxysilane and KBM3066 (manufactured by Shin-Etsu Silicone) were added so that they became 11 wt %, 10 wt % and 0.59 wt %, respectively, based on the total amount of liquid A, followed by mixing at 25° C. for 10 minutes, to obtain liquid A (concentration calculated as $SiO_2$ of the silane compound: 3.12 wt %).

Liquid B: The above commercial dispersion of particles was diluted by AP-11 so that the solid content concentration became 3.12 wt % to obtain liquid B (particle solid content concentration: 3.12 wt %).

Particle-containing silica precursor solution: Liquids A and B were mixed to attain the desired particle concentration ratio, followed by stirring at 25° C. for 30 minutes, and a 10 wt % nitric acid aqueous solution was added to be 0.54 wt % based on the total amount of the particle-containing silica precursor solution, followed by mixing at 60° C. for 60 minutes to obtain a particle-containing silica precursor solution (total solid content concentration (=concentration calculated as $SiO_2$ of the silane compound+particle solid content concentration): 3.11 wt %).

[Ex. 1]

(Cleaning of Translucent Substrate)

As a translucent substrate, a soda lime glass (FL1.1, manufactured by Asahi Glass Company, Limited, glass substrate with size: vertical 100 mm×horizontal 100 mm, thickness: 1.1 mm, average transmittance of light in a wavelength range of from 400 to 1,100 nm: 90.6%, arithmetic average roughness Ra at the surface: 0.5 nm) was prepared. The surface of the glass was washed with an aqueous sodium hydrogen carbonate solution, then rinsed with deionized water and dried.

(Preparation of Coating Liquid)

A coating liquid was obtained by diluting the particle-containing silica precursor solution obtained above with AP-11 to the total solid content concentration of 0.215 wt %.

(Electrostatic Coating Apparatus)

An electrostatic coating apparatus (liquid electrostatic coater, manufactured by Asahi Sunac Corporation) comprising an electrostatic spray gun, was prepared. As the electrostatic spray gun, a rotary atomizing automatic electrostatic gun (Sunbell, ESA120, manufactured by Asahi Sunac Corporation, cup diameter: 70 mm) was used. In order to facilitate grounding of a translucent substrate, a metal mesh tray was prepared as a conductive substrate.

(Electrostatic Coating)

In the coating booth of the electrostatic coating apparatus, the temperature was adjusted to be in a range of 25±1° C., and the humidity was adjusted to be in a range of 50%±10%.

On the chain conveyor of the electrostatic coating apparatus, the cleaned translucent substrate which had been preheated to 30° C.±3° C., was placed via the conductive substrate. While transporting at a constant speed by a chain conveyor, on the T surface (the surface opposite to the surface which was in contact with molten tin during the production by a float process) of the translucent substrate, the coating liquid at a temperature in a range of 25±1° C. was applied by the electrostatic coating method, followed by baking at 450° C. for 30 minutes in the atmospheric air to form an antiglare layer, to obtain a translucent structure. Coating conditions of the coating liquid were a coating liquid amount of 18 mL/min., a cup rotational speed of 35 krpm, a nozzle height of 245 mm, a voltage of 60 kV, and the number of applications being once. Here, the coating liquid amount represents the supply amount of the coating composition to the electrostatic spray gun. The cup rotational speed represents the rotation speed of the rotary atomizing head. The nozzle height represents the distance from the nozzle tip (front end of the rotary atomizing head in the spraying direction of the coating composition) of the electrostatic coating gun to the translucent substrate. The voltage represents the voltage applied to the electrostatic spray gun. The number of applications represents the transport number of the translucent substrate, namely the number of times of applying the coating composition by letting the translucent substrate pass under the electrostatic spray gun.

[Ex. 2 to 11, 13 to 30 and 34 to 39]

Translucent structures in Ex. 2 to 11, 13 to 30 and 34 to 39 were prepared in the same manner as in Ex. 1, except that the type of the dispersion of particles to be used for preparing the coating liquid, the particle concentration in the solid content of the coating liquid, the solid content concentration of the coating liquid, and the number of applications of the coating liquid, were changed as shown in Table 1.

[Ex. 12]

(Preparation of Translucent Substrate)

Special glass for chemical tempering, Dragontrail (registered trademark of Asahi Glass Company, Limited) (size: 100 mm×100 mm, thickness: 1.1 mm, transmittance at a wavelength of 550 nm: 91.4%, arithmetic average roughness Ra of the surface: 0.13 nm (as measured by SPA400-AFM, manufactured by SII Nanotechnology Inc.)), was subjected to chemical tempering treatment at 410° C. for 2.5 hours by using KNOB molten salt. As a result of the chemical tempering treatment, DOL (Depth Of Layer) was 25 µm, and CS (Compressive Stress) was 750 MPa. This chemical tempering-treated substrate was used as a translucent substrate. The surface of the translucent substrate was washed with neutral detergent, rinsed with pure water and dried.

(Formation of Antiglare Layer)

An antiglare layer was formed on the translucent substrate in the same manner as in Ex. 6, except that the above chemical tempering-treated substrate was used as the translucent substrate.

(Formation of Antireflection Layer by Vapor Deposition Method)

The translucent substrate having an antiglare layer formed as described above, was set on a substrate holder of a thin film forming apparatus.

After vacuuming and maintaining the substrate in a state of being heated at a set temperature of about 200° C., while introducing argon gas and oxygen gas to the thin film forming apparatus, at a pressure of about 0.03 Pa, $Ta_2O_5$ for a first layer of the high refractive index layer was formed in a film thickness of about 14 nm by electron beam vapor deposition. At that time, film formation was carried out while assisting argon ions and oxygen ions on the substrate by supplying Ar and $O_2$ gas to the ion source attached to the film forming apparatus and applying a voltage of 1,000 V and a current of 1,000 mA. Thereafter, also for the 2nd to 4th layers, the film formation was carried out in the same manner while assisting argon ions and oxygen ions on the substrate.

Then, at a pressure of about 0.03 Pa, $SiO_2$ for a second layer of the low refractive index layer was formed by electron beam vapor deposition in a film thickness of about 33 nm. Thereafter, in the same manner as for the first layer, $Ta_2O_5$ for the third layer of the high refractive index layer was formed in a film thickness of about 121 nm. Then, in the same manner as for the second layer, $SiO_2$ for the fourth layer of the low refractive index layer was formed in a film thickness of about 81 nm, to obtain a vapor deposited antireflection layer. Thus, a stacking was obtained in which the transparent substrate, the antiglare layer and the antireflection layer of the four-layer structure were stacked.

(Formation of AFP Layer)

After the surface of the above antireflection layer was subjected to cleaning treatment by using a plasma treating apparatus, on the layer at the outermost surface, a fluorinated oil repellent (Afluid, registered trademark of Asahi Glass Company, Limited "S-550") was film-formed by a vapor deposition method under conditions of a vacuuming degree prior to the deposition: $1×10^{-3}$ Pa, a vapor deposition source heating temperature: 290° C., and a substrate temperature: no heating, to form an AFP layer having a thickness of about 10 nm. Thus, a translucent structure was obtained in which the translucent substrate, the antiglare layer and the AFP layer were stacked, or the translucent substrate, the antiglare layer, the antireflection layer and the AFP layer were stacked. For the thickness of the AFP layer in this Example, by using X ray diffractometer ATX-G (Rigaku Corporation) for thin film analysis, an interference pattern of the reflected X-ray was obtained by the X-ray reflectance method, and the thickness was calculated from the vibration period of the interference pattern.

[Ex. 31]

By the following procedure, a fine uneven shape was formed at the surface of a glass substrate being a transparent substrate.

(1) To 1,000 mL of a 50 wt % hydrogen fluoride aqueous solution, 500 g of ammonium fluoride and 175 g of glass beads having an average particle size of 4 μm were added and stirred to prepare a frost treatment liquid. (2) An aluminosilicate glass substrate of 5 cm square with a thickness of 1.3 mm was immersed in the above frost solution for 8 minutes to carry out pre-etching treatment. (3) The aluminosilicate glass substrate was taken out from the frost solution and washed with flowing water for 10 minutes, and thereafter, it was immersed in a 20 wt % hydrogen fluoride aqueous solution for 16 minutes to carry out etching treatment, to form fine unevenness on the surface of the aluminosilicate glass substrate. This translucent substrate was regarded as the translucent structure in Ex. 31.

[Ex. 32]

A translucent substrate having an uneven structure at the surface was obtained in the same manner as in Ex. 31, except that the frost treatment liquid was changed to one having 500 g of ammonium fluoride and 355 g of glass beads having an average particle diameter of 4 μm added to 1,000 mL of a 50 wt % hydrogen fluoride aqueous solution. To this translucent substrate, the chemical tempering treatment was applied in the same manner as in Ex. 12, and then, the surface was washed with a neutral detergent, rinsed with pure water and dried.

On the surface having an uneven structure of this translucent substrate, an antireflection layer and an AFP layer were formed in the same manner as in Ex. 12. After forming the AFP layer, heat treatment was carried out in the atmospheric air at 120° C. for 20 minutes. Thus, a translucent structure was obtained in which the translucent substrate, the antireflection layer and the AFP layer were stacked.

[Ex. 33]

A translucent substrate having an uneven structure at the surface was obtained in the same manner as in Ex. 31, except that the frost treatment liquid was changed to one having 500 g of ammonium fluoride and 350 g of glass beads having an average particle diameter of 4 μm added to 1,000 mL of a 50 wt % hydrogen fluoride aqueous solution. To this translucent substrate, the chemical tempering treatment was applied in the same manner as in Ex. 12, and then, the surface was washed with a neutral detergent, rinsed with pure water and dried.

On the surface having an uneven structure of this translucent substrate, an antireflection layer and an AFP layer were formed in the same manner as in Ex. 12. After forming the AFP layer, heat treatment was carried out in the atmospheric air at 120° C. for 20 minutes. Thus, a translucent structure was obtained in which the translucent substrate, the antireflection layer and the AFP layer were stacked.

The above-mentioned evaluations were conducted with respect to the translucent structures obtained in Ex. 1 to 39. The results are shown in Tables 2 to 4.

Figure 9:
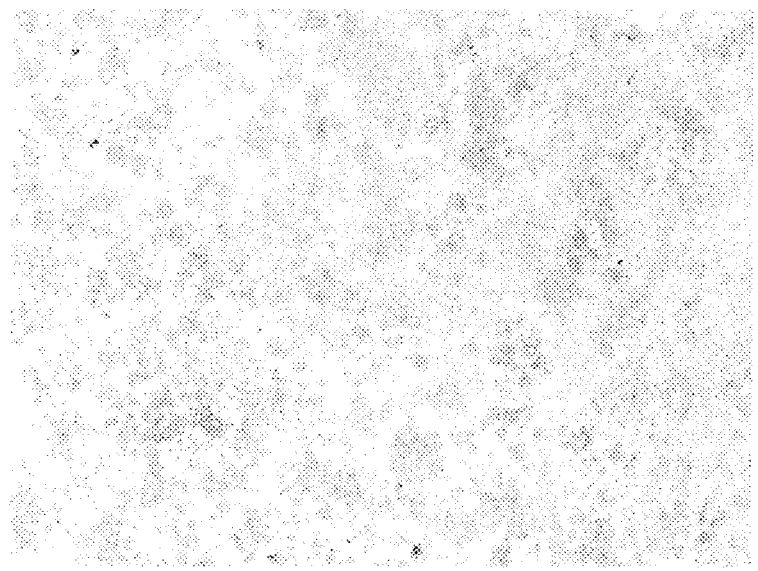
FIG. 9 is a laser microscope image of the surface on the antiglare layer side in the translucent structure in Ex. 1.
Figure 10:
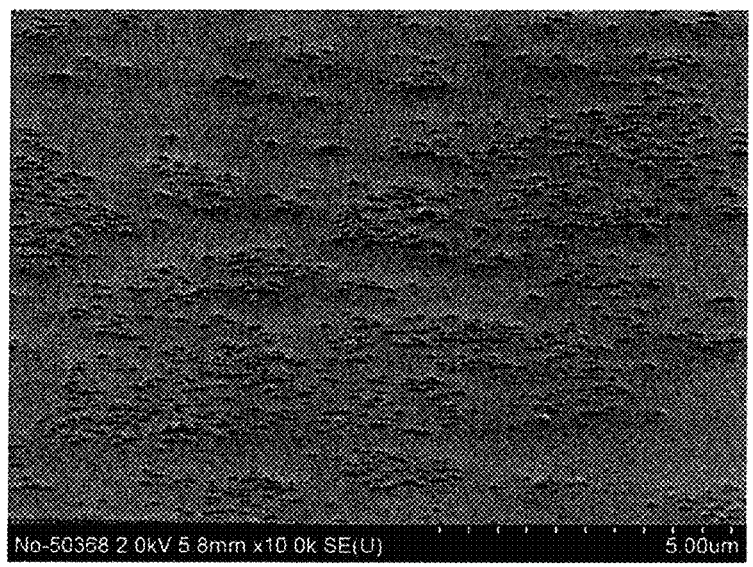
FIG. 10 is a scanning electron microscope (SEM) image of the surface on the antiglare layer side in the translucent structure in Ex. 1 as observed from obliquely above at an angle of 60 degrees.

FIGS. 9 and 10 show a laser microscope image of the surface on the antiglare layer-side of the translucent structure in Ex. 1 and a scanning electron microscope (SEM) image of the same surface as observed from obliquely above at an angle of 60 degrees. Further, FIGS. 11 and 12 show images having the surface shape on the antiglare layer side of the translucent structure in Ex. 1 analyzed by SPIP.

Figure 13:
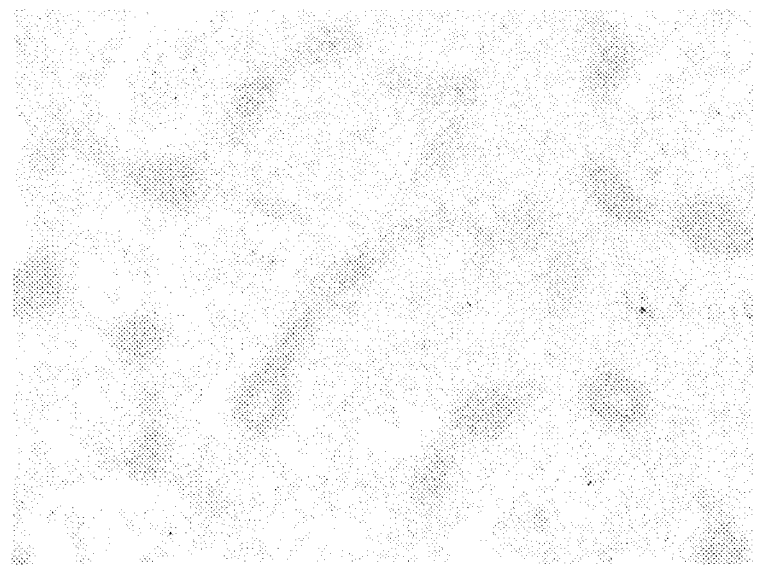
FIG. 13 is a laser microscope image of the surface on the antiglare layer side in the translucent structure in Ex. 21.

FIG. 13 shows a laser microscope image of the surface on the antiglare layer side of the translucent structure in Ex. 21. Further, FIGS. 14 and 15 show images having the surface shape on the antiglare layer side of the translucent structure in Ex. 21 analyzed by SPIP.

Figure 16:
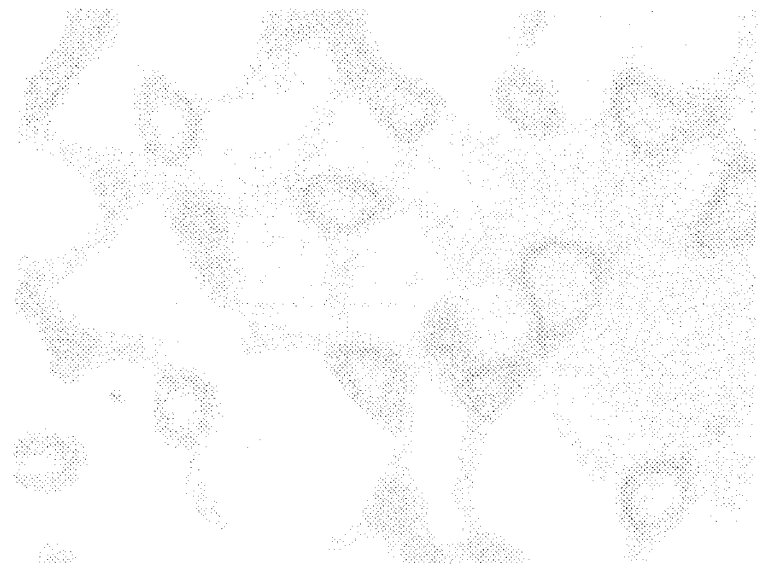
FIG. 16 is a laser microscope image of the surface on the antiglare layer side of the translucent structure in Ex. 34.

FIG. 16 shows a laser microscope image of the surface on the antiglare layer side of the translucent structure in Ex. 34. Further, FIGS. 17 and 18 show images having the surface shape on the antiglare layer side of the translucent structure in Ex. 34 analyzed by SPIP.

Figure 11:
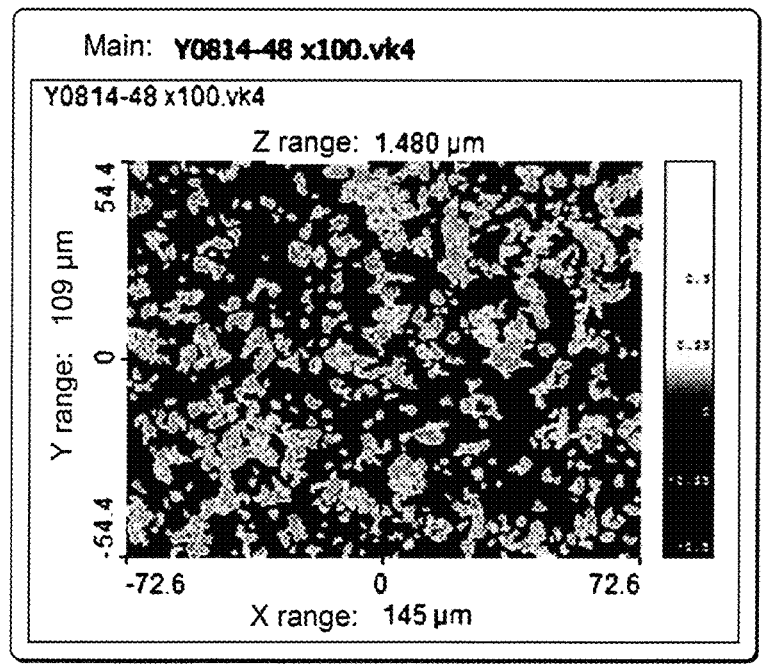
FIG. 11 is an image of the surface shape on the antiglare layer side of the translucent structure in Ex. 1, as analyzed by SPIP (cross-section at a height of the bearing height+0.05 μm).
Figure 12:
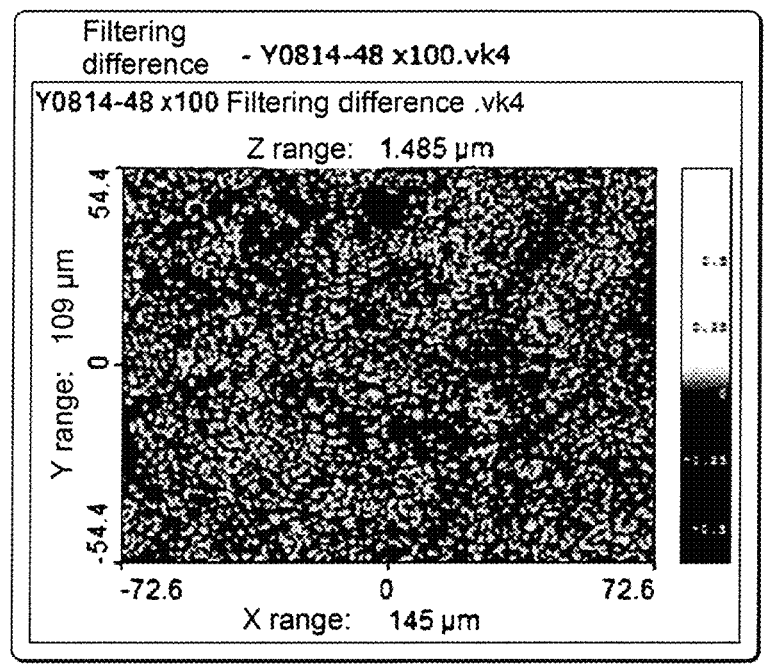
FIG. 12 is an image of the surface shape on the antiglare layer side of the translucent structure in Ex. 1 as analyzed by SPIP (cross-section at a height of 0.01 μm of the image obtainable as the difference between XYZ data of the surface shape and XYZ data of the smoothing image).
Figure 14:
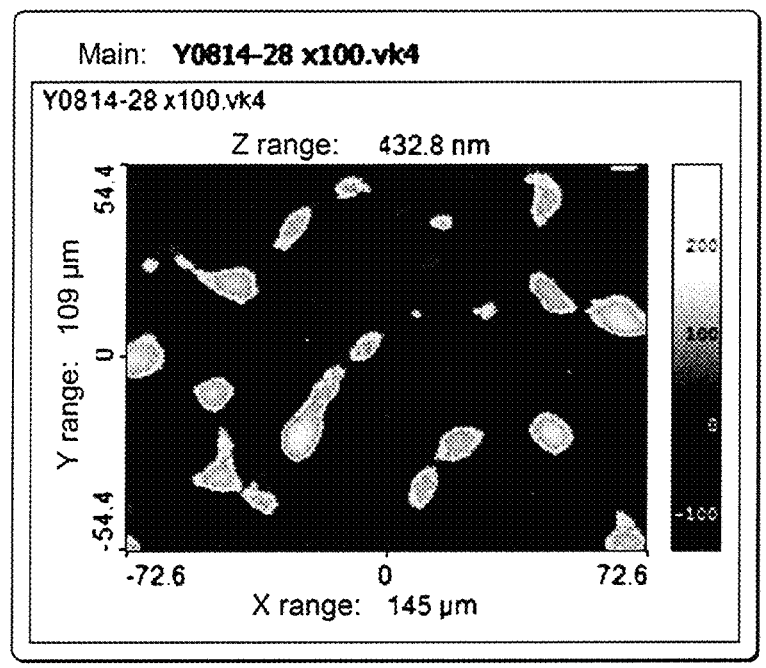
FIG. 14 is an image of the surface shape on the antiglare layer side of the translucent structure in Ex. 21, as analyzed by SPIP (cross section at a height of the bearing height+0.05 μm).
Figure 15:
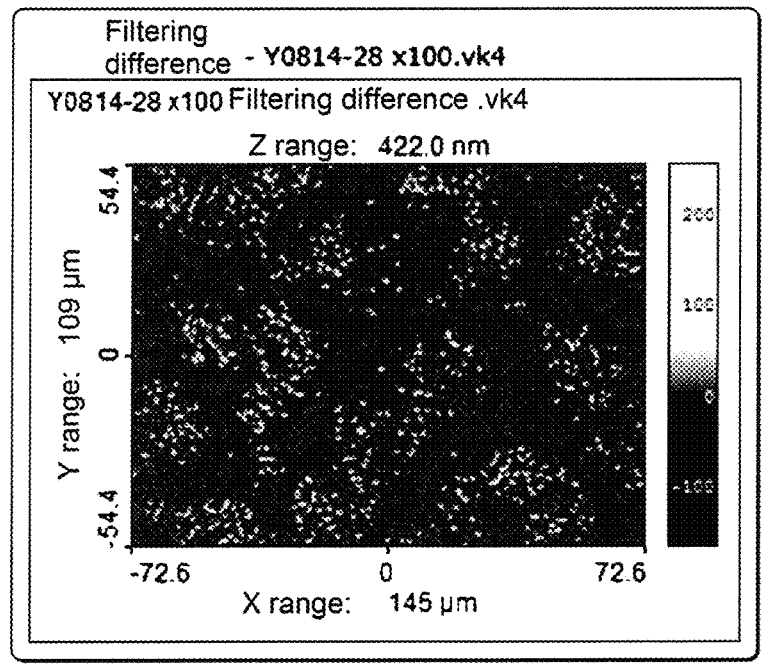
FIG. 15 is an image of the surface shape on the antiglare layer side of the translucent structure in Ex. 21, as analyzed by SPIP (cross-section at a height of 0.01 μm of the image obtainable as the difference between XYZ data of the surface shape and XYZ data of the smoothing image).
Figure 17:
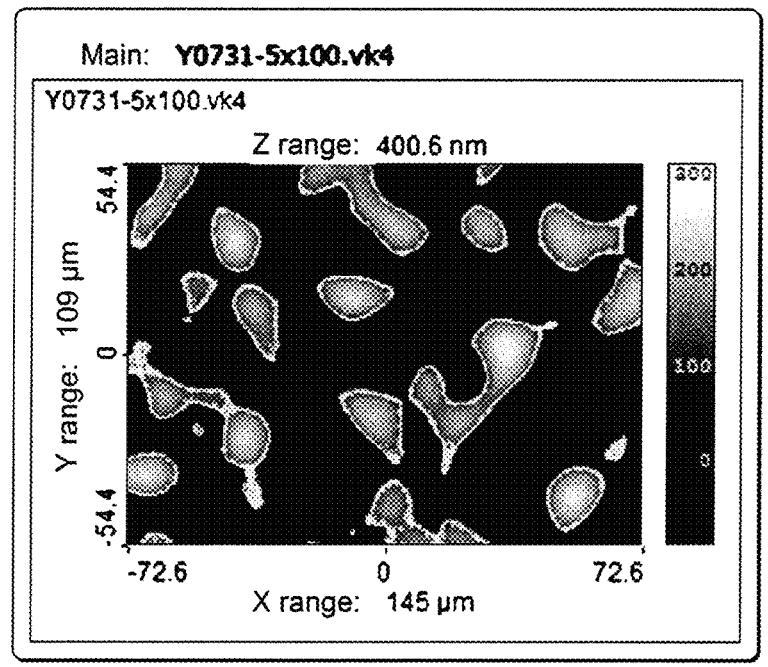
FIG. 17 is an image of the surface shape on the antiglare layer side of the translucent structure in Ex. 34 as analyzed by SPIP (cross section at a height of the bearing height+0.05 μm).
Figure 18:
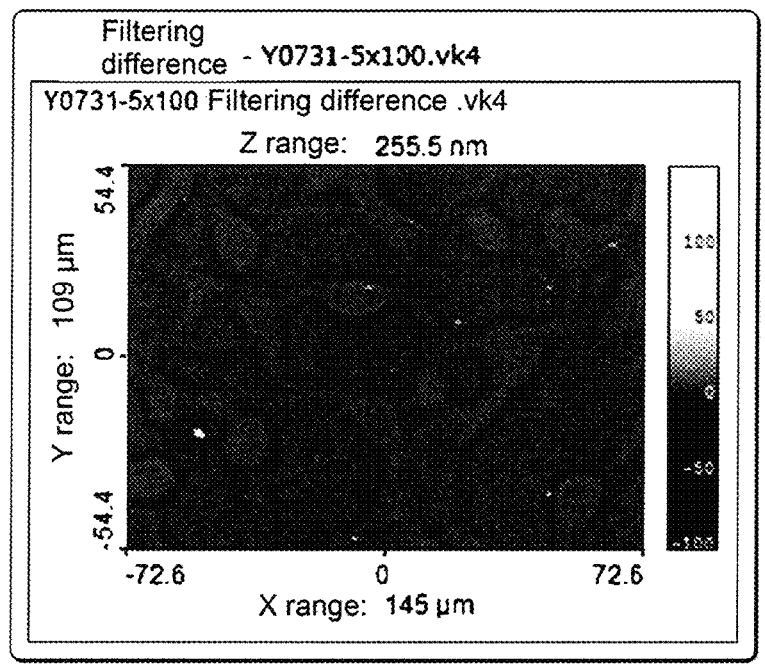
FIG. 18 is an image of the surface shape on the antiglare layer side of the translucent structure in Ex. 34 as analyzed by SPIP (cross-section at a height of 0.01 μm of the image obtainable as the difference between XYZ data of the surface shape and XYZ data of the smoothing image).

Each of FIGS. 11, 14 and 17 shows a cross section at a height of the bearing height+0.05 μm of the surface shape, and each of FIGS. 12, 15 and 18 shows a cross section at a height of 0.01 μm of an image (image in which a plurality of convex portions are scattered on a plane) obtainable as a difference between XYZ data of the surface shape and XYZ data of a smoothing image obtained by filtering it. In each Fig., portions in bright color represent cross-sections of convex portions.

Figure 19:
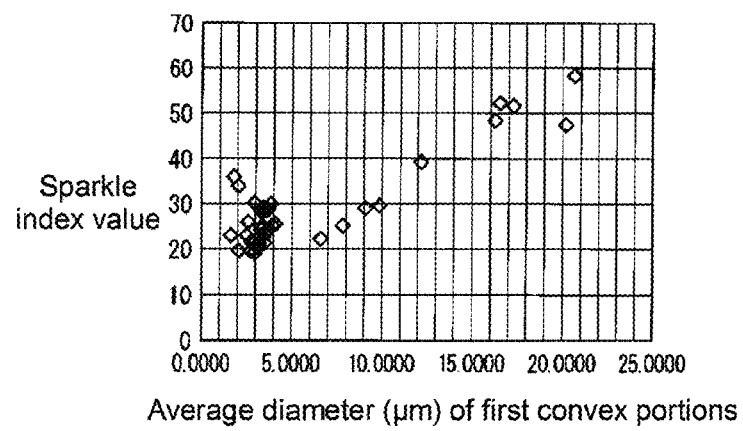
FIG. 19 is a graph showing the relationship between the average diameter of the first convex portions and the sparkle index value in Ex. 1 to 39.
Figure 20:
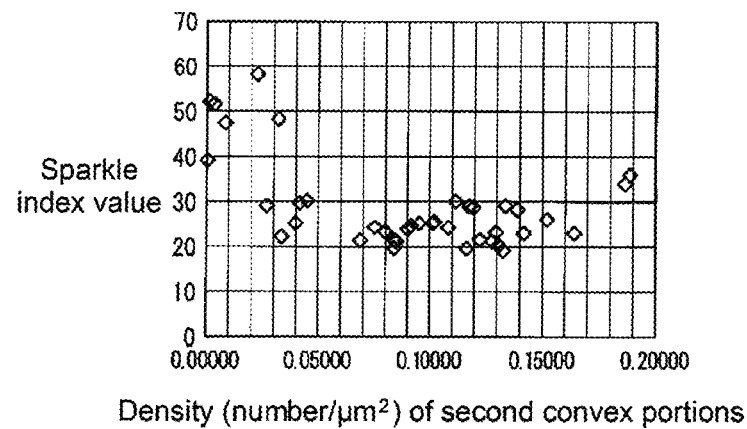
FIG. 20 is a graph showing the relationship between the density of the second convex portions and the sparkle index value in Ex. 1 to 39.
Figure 21:
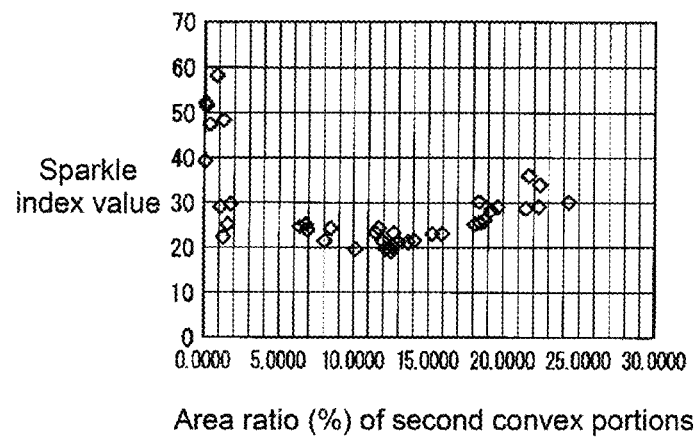
FIG. 21 is a graph showing the relationship between the area ratio of the second convex portions and the sparkle index value in Ex. 1 to 39.

Further, from the evaluation results in Ex. 1 to 39, a graph showing the relation between the sparkle index value S and each of the average diameter of the first convex portions, the density of the second convex portions, and the area ratio of the second convex portions, was prepared. Such graphs are shown in FIGS. 19 to 21.

TABLE 1

| Ex. No. | Film structure | AG processing method | Particles | Particle concentration in coating liquid (%) | Solid content concentration in coating liquid (wt %) | Number of coating times (times) |
|---|---|---|---|---|---|---|
| 1 | Glass/AG | Electrostatic spray | ST-OZL | 15 | 0.215 | 1 |
| 2 | Glass/AG | Electrostatic spray | ST-OZL | 10 | 0.215 | 1 |
| 3 | Glass/AG | Electrostatic spray | SLV | 11 | 0.215 | 1 |
| 4 | Glass/AG | Electrostatic spray | ST-OZL | 15 | 0.215 | 1 |
| 5 | Glass/AG | Electrostatic spray | SLV | 9 | 0.215 | 1 |
| 6 | Glass/AG | Electrostatic spray | SLV | 5 | 0.215 | 2 |
| 7 | Glass/AG | Electrostatic spray | SLV | 7 | 0.215 | 1 |
| 8 | Glass/AG | Electrostatic spray | SLV | 3 | 0.215 | 1 |
| 9 | Glass/AG | Electrostatic spray | SLV | 9 | 0.215 | 1 |
| 10 | Glass/AG | Electrostatic spray | ST-OL | 15 | 0.215 | 1 |
| 11 | Glass/AG | Electrostatic spray | SLV | 9 | 0.215 | 1 |

TABLE 1-continued

| Ex. No. | Film structure | AG processing method | Particles | Particle concentration in coating liquid (%) | Solid content concentration in coating liquid (wt %) | Number of coating times (times) |
|---|---|---|---|---|---|---|
| 12 | Glass (tempered)/AG/AR/AFP | Electrostatic spray | SLV | 5 | 0.215 | 2 |
| 13 | Glass/AG | Electrostatic spray | ST-OZL | 15 | 0.215 | 1 |
| 14 | Glass/AG | Electrostatic spray | SLV | 5 | 0.215 | 1 |
| 15 | Glass/AG | Electrostatic spray | ST-OZL | 5 | 0.215 | 1 |
| 16 | Glass/AG | Electrostatic spray | ST-OZL | 15 | 0.215 | 2 |
| 17 | Glass/AG | Electrostatic spray | SLV | 5 | 0.215 | 1 |
| 18 | Glass/AG | Electrostatic spray | ST-OZL | 5 | 0.215 | 1 |
| 19 | Glass/AG | Electrostatic spray | ST-OZL | 5 | 0.215 | 1 |
| 20 | Glass/AG | Electrostatic spray | SLV | 9 | 0.215 | 2 |
| 21 | Glass/AG | Electrostatic spray | ST-OL | 10 | 0.215 | 1 |
| 22 | Glass/AG | Electrostatic spray | SLV | 7 | 0.215 | 2 |
| 23 | Glass/AG | Electrostatic spray | SLV | 9 | 0.215 | 2 |
| 24 | Glass/AG | Electrostatic spray | SLV | 9 | 0.215 | 2 |
| 25 | Glass/AG | Electrostatic spray | SLV | 9 | 0.215 | 3 |
| 26 | Glass/AG | Electrostatic spray | SLV | 7 | 0.215 | 3 |
| 27 | Glass/AG | Electrostatic spray | ST-OL | 5 | 0.215 | 1 |
| 28 | Glass/AG | Electrostatic spray | SLV | 9 | 0.215 | 2 |
| 29 | Glass/AG | Electrostatic spray | ST-OL | 10 | 0.215 | 1 |
| 30 | Glass/AG | Electrostatic spray | SLV | 11 | 0.215 | 3 |
| 31 | Etching AG-Glass | Etching | — | — | — | — |
| 32 | Etching AG-Glass (tempered)/AR/AFP | Etching | — | — | — | — |
| 33 | Etching AG-Glass (tempered)/AR/AFP | Etching | — | — | — | — |
| 34 | Glass/AG | Electrostatic spray | Nil | 0 | 0.215 | 1 |
| 35 | Glass/AG | Electrostatic spray | ST-O | 15 | 0.215 | 3 |
| 36 | Glass/AG | Electrostatic spray | ST-OL | 10 | 0.215 | 2 |
| 37 | Glass/AG | Electrostatic spray | ST-O | 15 | 0.215 | 2 |
| 38 | Glass/AG | Electrostatic spray | ST-O | 5 | 0.215 | 1 |
| 39 | Glass/AG | Electrostatic spray | ST-OL | 5 | 0.215 | 2 |

TABLE 2

| | First convex portions | | | | | | | | | |
|---|---|---|---|---|---|---|---|---|---|---|
| Ex. No. | Z range (µm) | Number in observation region (units) | Density (units/µm²) | Area ratio (%) | Maximum diameter (µm) | Minimum diameter (µm) | Average diameter (µm) | Maximum height (µm) | Minimum height (µm) | Average height (µm) |
| 1 | 1.480 | 351 | 0.022 | 26.685 | 20.865 | 1.001 | 2.965 | 0.946 | 0.077 | 0.161 |
| 2 | 1.063 | 59 | 0.004 | 2.139 | 12.284 | 1.007 | 2.072 | 0.235 | 0.086 | 0.143 |
| 3 | 2.894 | 362 | 0.023 | 19.293 | 13.631 | 1.001 | 2.700 | 1.744 | 0.109 | 0.322 |
| 4 | 0.730 | 305 | 0.019 | 30.573 | 28.252 | 1.007 | 3.125 | 0.305 | 0.081 | 0.139 |
| 5 | 2.406 | 332 | 0.021 | 22.403 | 16.634 | 1.020 | 2.884 | 1.254 | 0.092 | 0.290 |
| 6 | 2.159 | 318 | 0.020 | 28.271 | 18.573 | 1.011 | 3.169 | 1.365 | 0.189 | 0.343 |
| 7 | 1.767 | 340 | 0.022 | 21.177 | 14.218 | 1.003 | 2.889 | 1.159 | 0.087 | 0.243 |
| 8 | 0.412 | 235 | 0.015 | 27.917 | 26.330 | 1.003 | 3.493 | 0.338 | 0.083 | 0.171 |
| 9 | 2.683 | 388 | 0.025 | 23.213 | 14.329 | 1.001 | 2.754 | 1.364 | 0.138 | 0.376 |
| 10 | 0.419 | 20 | 0.001 | 5.497 | 13.780 | 1.576 | 6.603 | 0.172 | 0.088 | 0.103 |
| 11 | 2.531 | 334 | 0.021 | 15.625 | 15.917 | 1.001 | 2.520 | 1.247 | 0.132 | 0.325 |
| 12 | 1.568 | 582 | 0.037 | 8.726 | 8.028 | 1.001 | 1.627 | 0.633 | 0.154 | 0.287 |
| 13 | 0.962 | 279 | 0.018 | 32.639 | 23.929 | 1.002 | 3.500 | 0.455 | 0.077 | 0.145 |
| 14 | 0.538 | 261 | 0.017 | 30.425 | 23.575 | 1.015 | 3.550 | 0.478 | 0.082 | 0.183 |
| 15 | 0.820 | 204 | 0.013 | 29.935 | 35.669 | 1.012 | 3.546 | 0.242 | 0.077 | 0.124 |
| 16 | 0.756 | 137 | 0.009 | 15.755 | 17.583 | 1.004 | 3.307 | 0.373 | 0.090 | 0.158 |
| 17 | 0.528 | 255 | 0.016 | 31.393 | 22.823 | 1.007 | 3.736 | 0.400 | 0.085 | 0.190 |
| 18 | 1.930 | 232 | 0.015 | 26.927 | 21.475 | 1.001 | 3.306 | 1.192 | 0.080 | 0.139 |
| 19 | 1.083 | 211 | 0.013 | 31.933 | 38.213 | 1.008 | 3.405 | 0.568 | 0.086 | 0.142 |
| 20 | 2.086 | 207 | 0.013 | 45.367 | 51.562 | 1.026 | 3.914 | 1.306 | 0.086 | 0.312 |
| 21 | 0.433 | 23 | 0.001 | 8.438 | 15.293 | 1.393 | 7.819 | 0.237 | 0.086 | 0.153 |
| 22 | 1.626 | 199 | 0.013 | 46.883 | 39.635 | 1.006 | 4.099 | 1.129 | 0.093 | 0.268 |
| 23 | 3.051 | 367 | 0.023 | 19.342 | 16.603 | 1.000 | 2.584 | 1.756 | 0.128 | 0.316 |
| 24 | 2.781 | 276 | 0.017 | 42.760 | 40.078 | 1.004 | 3.332 | 1.183 | 0.140 | 0.330 |
| 25 | 3.683 | 300 | 0.019 | 37.613 | 18.394 | 1.004 | 3.680 | 2.172 | 0.095 | 0.354 |
| 26 | 2.521 | 313 | 0.020 | 31.827 | 21.901 | 1.005 | 3.334 | 1.330 | 0.087 | 0.287 |
| 27 | 0.406 | 28 | 0.002 | 15.275 | 20.431 | 1.024 | 9.051 | 0.300 | 0.087 | 0.159 |
| 28 | 2.690 | 320 | 0.020 | 36.567 | 22.363 | 1.007 | 3.390 | 1.683 | 0.132 | 0.358 |
| 29 | 0.847 | 22 | 0.001 | 14.296 | 24.768 | 1.866 | 9.855 | 0.324 | 0.088 | 0.153 |
| 30 | 4.118 | 97 | 0.006 | 65.237 | 124.934 | 1.008 | 3.851 | 2.143 | 0.102 | 0.348 |
| 31 | 0.458 | 210 | 0.013 | 12.767 | 11.344 | 1.004 | 2.953 | 0.182 | 0.076 | 0.120 |
| 32 | 1.256 | 119 | 0.008 | 3.331 | 7.934 | 1.004 | 2.051 | 0.628 | 0.156 | 0.224 |

TABLE 2-continued

| | First convex portions | | | | | | | | | |
|---|---|---|---|---|---|---|---|---|---|---|
| Ex. No. | Z range (μm) | Number in observation region (units) | Density (units/μm$^2$) | Area ratio (%) | Maximum diameter (μm) | Minimum diameter (μm) | Average diameter (μm) | Maximum height (μm) | Minimum height (μm) | Average height (μm) |
| 33 | 1.458 | 108 | 0.007 | 2.111 | 4.968 | 1.007 | 1.786 | 0.608 | 0.147 | 0.208 |
| 34 | 0.401 | 23 | 0.001 | 23.326 | 27.042 | 1.086 | 12.172 | 0.314 | 0.076 | 0.211 |
| 35 | 1.379 | 7 | 0.000 | 57.328 | 125.284 | 1.112 | 20.196 | 0.702 | 0.082 | 0.196 |
| 36 | 1.214 | 11 | 0.001 | 36.670 | 74.385 | 1.103 | 16.275 | 0.843 | 0.090 | 0.268 |
| 37 | 0.525 | 12 | 0.001 | 40.016 | 86.692 | 1.912 | 17.272 | 0.328 | 0.106 | 0.202 |
| 38 | 0.463 | 18 | 0.001 | 28.663 | 29.576 | 7.453 | 16.524 | 0.226 | 0.116 | 0.169 |
| 39 | 0.887 | 9 | 0.001 | 36.931 | 81.623 | 1.247 | 20.663 | 0.436 | 0.091 | 0.263 |

TABLE 3

| | Second convex portions | | | | | | | | | |
|---|---|---|---|---|---|---|---|---|---|---|
| Ex. No. | Z range (μm) | Number in observation region (units) | Density (units/μm$^2$) | Area ratio (%) | Maximum diameter (μm) | Minimum diameter (μm) | Average diameter (μm) | Maximum height (μm) | Minimum height (μm) | Average height (μm) |
| 1 | 1.485 | 2,097 | 0.133 | 12.468 | 4.426 | 0.401 | 0.990 | 0.775 | 0.024 | 0.075 |
| 2 | 1.101 | 1,843 | 0.117 | 10.120 | 3.939 | 0.400 | 0.947 | 0.196 | 0.021 | 0.064 |
| 3 | 2.702 | 1,328 | 0.084 | 12.148 | 3.820 | 0.401 | 1.203 | 1.120 | 0.021 | 0.120 |
| 4 | 0.731 | 2,068 | 0.131 | 12.577 | 4.018 | 0.400 | 0.996 | 0.273 | 0.028 | 0.094 |
| 5 | 2.366 | 1,341 | 0.085 | 13.614 | 4.148 | 0.401 | 1.257 | 0.946 | 0.019 | 0.105 |
| 6 | 1.806 | 2,022 | 0.128 | 12.944 | 3.509 | 0.400 | 1.020 | 0.939 | 0.046 | 0.181 |
| 7 | 1.697 | 1,324 | 0.084 | 11.946 | 4.549 | 0.400 | 1.209 | 0.670 | 0.021 | 0.086 |
| 8 | 0.240 | 1,089 | 0.069 | 8.037 | 3.521 | 0.400 | 1.113 | 0.167 | 0.024 | 0.065 |
| 9 | 2.596 | 1,935 | 0.122 | 14.053 | 3.947 | 0.400 | 1.087 | 0.969 | 0.026 | 0.150 |
| 10 | 0.386 | 531 | 0.034 | 1.279 | 1.636 | 0.400 | 0.659 | 0.285 | 0.021 | 0.041 |
| 11 | 2.374 | 2,240 | 0.142 | 15.280 | 3.455 | 0.400 | 1.046 | 1.105 | 0.081 | 0.140 |
| 12 | 1.542 | 2,594 | 0.164 | 15.950 | 13.200 | 0.400 | 0.955 | 0.507 | 0.043 | 0.194 |
| 13 | 0.747 | 2,048 | 0.130 | 12.657 | 3.735 | 0.401 | 1.006 | 0.208 | 0.019 | 0.065 |
| 14 | 0.312 | 1,264 | 0.080 | 11.467 | 3.491 | 0.400 | 1.227 | 0.226 | 0.020 | 0.074 |
| 15 | 0.786 | 1,422 | 0.090 | 6.894 | 3.120 | 0.400 | 0.894 | 0.675 | 0.021 | 0.054 |
| 16 | 0.717 | 1,712 | 0.108 | 8.439 | 3.197 | 0.400 | 0.900 | 0.301 | 0.021 | 0.069 |
| 17 | 0.334 | 1,191 | 0.075 | 11.644 | 4.869 | 0.402 | 1.266 | 0.188 | 0.022 | 0.067 |
| 18 | 1.820 | 1,446 | 0.091 | 6.394 | 2.890 | 0.400 | 0.859 | 0.951 | 0.024 | 0.062 |
| 19 | 0.815 | 1,504 | 0.095 | 6.789 | 2.785 | 0.400 | 0.873 | 0.222 | 0.022 | 0.065 |
| 20 | 2.132 | 1,602 | 0.101 | 18.116 | 4.399 | 0.400 | 1.346 | 0.836 | 0.025 | 0.133 |
| 21 | 0.422 | 629 | 0.040 | 1.564 | 1.517 | 0.400 | 0.670 | 0.211 | 0.020 | 0.050 |
| 22 | 1.563 | 1,615 | 0.102 | 18.450 | 4.199 | 0.401 | 1.368 | 0.680 | 0.028 | 0.093 |
| 23 | 2.888 | 2,402 | 0.152 | 18.743 | 3.635 | 0.401 | 1.127 | 0.984 | 0.045 | 0.147 |
| 24 | 3.218 | 2,195 | 0.139 | 19.178 | 4.397 | 0.400 | 1.177 | 1.303 | 0.047 | 0.164 |
| 25 | 3.455 | 1,888 | 0.119 | 21.485 | 4.383 | 0.401 | 1.362 | 1.012 | 0.022 | 0.170 |
| 26 | 2.308 | 1,861 | 0.118 | 19.636 | 4.051 | 0.400 | 1.312 | 1.067 | 0.027 | 0.104 |
| 27 | 0.211 | 426 | 0.027 | 1.073 | 1.570 | 0.400 | 0.675 | 0.128 | 0.023 | 0.044 |
| 28 | 2.652 | 2,115 | 0.134 | 22.367 | 4.267 | 0.400 | 1.296 | 1.241 | 0.051 | 0.164 |
| 29 | 0.649 | 658 | 0.042 | 1.779 | 1.726 | 0.400 | 0.697 | 0.150 | 0.021 | 0.043 |
| 30 | 3.890 | 1,766 | 0.112 | 24.350 | 4.994 | 0.402 | 1.482 | 1.382 | 0.032 | 0.154 |
| 31 | 0.210 | 712 | 0.045 | 18.391 | 13.062 | 0.403 | 1.788 | 0.148 | 0.023 | 0.048 |
| 32 | 1.126 | 2,946 | 0.186 | 22.415 | 7.800 | 0.400 | 1.001 | 0.316 | 0.082 | 0.264 |
| 33 | 1.345 | 2,980 | 0.189 | 21.697 | 7.166 | 0.400 | 1.004 | 0.302 | 0.057 | 0.144 |
| 34 | 0.256 | 8 | 0.001 | 0.031 | 2.187 | 0.416 | 0.672 | 0.112 | 0.045 | 0.062 |
| 35 | 1.274 | 133 | 0.008 | 0.366 | 2.117 | 0.402 | 0.684 | 0.098 | 0.021 | 0.042 |
| 36 | 1.082 | 507 | 0.032 | 1.267 | 1.616 | 0.400 | 0.675 | 0.251 | 0.022 | 0.049 |
| 37 | 0.385 | 57 | 0.004 | 0.129 | 1.671 | 0.401 | 0.637 | 0.113 | 0.022 | 0.043 |
| 38 | 0.339 | 23 | 0.001 | 0.038 | 0.825 | 0.411 | 0.562 | 0.068 | 0.029 | 0.048 |
| 39 | 0.781 | 358 | 0.023 | 0.805 | 1.514 | 0.403 | 0.645 | 0.117 | 0.016 | 0.047 |

TABLE 4

| Ex. No. | Haze factor (%) | 60° specular gloss (%) | Diffusion Diffusion | Glare measurement | | Half-value width of projection distribution (nm) | Pencil hardness |
|---|---|---|---|---|---|---|---|
| | | | | Glare index value S | Evaluation | | |
| 1 | 1.5 | 124 | 0.06 | 19 | ⊚⊚ | 89 | 5H |
| 2 | 1.2 | 125 | 0.06 | 20 | ⊚⊚ | 104 | 5H |
| 3 | 5.7 | 107 | 0.07 | 20 | ⊚⊚ | 41 | 5H |

TABLE 4-continued

| Ex. No. | Haze factor (%) | 60° specular gloss (%) | Diffusion Diffusion | Glare measurement Glare index value S | Glare measurement Evaluation | Half-value width of projection distribution (nm) | Pencil hardness |
|---|---|---|---|---|---|---|---|
| 4 | 1.5 | 123 | 0.06 | 20 | ◎◎ | 104 | 5H |
| 5 | 4.8 | 109 | 0.07 | 21 | ◎◎ | 38 | 5H |
| 6 | 4.0 | 103 | 0.14 | 21 | ◎◎ | 168 | 5H |
| 7 | 3.9 | 113 | 0.07 | 21 | ◎◎ | 35 | 5H |
| 8 | 1.9 | 117 | 0.09 | 21 | ◎◎ | 64 | 5H |
| 9 | 5.4 | 105 | 0.08 | 22 | ◎◎ | 107 | 5H |
| 10 | 0.5 | 130 | 0.07 | 22 | ◎◎ | 55 | 5H |
| 11 | 5.9 | 104 | 0.08 | 23 | ◎◎ | 106 | 5H |
| 12 | 2.2 | 107 | 0.07 | 23 | ◎◎ | 135 | 5H |
| 13 | 1.7 | 123 | 0.06 | 23 | ◎◎ | 100 | 5H |
| 14 | 3.2 | 112 | 0.09 | 23 | ◎◎ | 50 | 5H |
| 15 | 1.0 | 125 | 0.08 | 24 | ◎◎ | 90 | 5H |
| 16 | 0.9 | 120 | 0.08 | 24 | ◎◎ | 76 | 5H |
| 17 | 3.0 | 112 | 0.09 | 24 | ◎◎ | 37 | 5H |
| 18 | 0.9 | 127 | 0.08 | 25 | ◎◎ | 100 | 5H |
| 19 | 0.8 | 127 | 0.08 | 25 | ◎◎ | 100 | 5H |
| 20 | 7.3 | 91 | 0.11 | 25 | ◎◎ | 88 | 5H |
| 21 | 0.4 | 129 | 0.08 | 25 | ◎◎ | 64 | 5H |
| 22 | 5.9 | 96 | 0.11 | 26 | ◎ | 94 | 5H |
| 23 | 7.6 | 89 | 0.14 | 26 | ◎ | 183 | 5H |
| 24 | 8.7 | 85 | 0.13 | 28 | ◎ | 184 | 5H |
| 25 | 9.7 | 78 | 0.14 | 29 | ◎ | 206 | 5H |
| 26 | 7.9 | 84 | 0.13 | 29 | ◎ | 192 | 5H |
| 27 | 0.4 | 128 | 0.10 | 29 | ◎ | 63 | 5H |
| 28 | 9.5 | 82 | 0.13 | 29 | ◎ | 210 | 5H |
| 29 | 0.5 | 128 | 0.09 | 30 | ◎ | 75 | 5H |
| 30 | 13.2 | 67 | 0.16 | 30 | ◎ | 239 | 5H |
| 31 | 5.4 | 114 | 0.12 | 30 | ◎ | 145 | 6H |
| 32 | 1.0 | 112 | 0.12 | 34 | ○ | 163 | 6H |
| 33 | 1.1 | 111 | 0.11 | 36 | ○ | 158 | 6H |
| 34 | 0.30 | 125 | 0.12 | 39 | X | 42 | 5H |
| 35 | 1.1 | 103 | 0.30 | 47 | X | 190 | 5H |
| 36 | 0.7 | 115 | 0.20 | 48 | X | 61 | 5H |
| 37 | 0.8 | 111 | 0.22 | 52 | X | 54 | 5H |
| 38 | 0.2 | 128 | 0.13 | 52 | X | 37 | 5H |
| 39 | 0.7 | 114 | 0.23 | 58 | X | 59 | 5H |

In Table 1, "Glass", "Glass (tempered)", "Etching AG-Glass", or "Etching AG-Glass (tempered)" in the film structure, represents the translucent substrate in the translucent structure of each Ex. "AG", "AR" and "AFP" represent an anti-glare layer, an antireflection layer and an AFP layer, respectively. "Electrostatic spray" represents an electrostatic coating method using a rotary atomization type automatic electrostatic gun.

The translucent structure in each of Ex. 1 to 33 had a haze factor of at least 0.1%, a value of Diffusion being low, and antiglare properties. Further, the sparkle index S was at most 36, and thus, sparkle was practically sufficient suppressed. Further, since the haze factor was at most 15%, it can be judged that the image visibility will be good when such a translucent structure is disposed on the viewing side of an image display device. On the other hand, the translucent structure in each of Ex. 34 to 39, remarkable sparkle was observed.

From the graph in FIG. 19, it was confirmed that as the average diameter of the first convex portions was smaller, sparkle tended to decrease. From FIGS. 20 and 21, it was confirmed that when the density of the second convex portions, or the area ratio of the second convex portions, was within the specific range, sparkle tended to decrease.

INDUSTRIAL APPLICABILITY

The translucent structure of the present invention can be used in various applications including image display devices, from the viewpoints of its optical characteristics such as a low haze factor, low sparkle properties, etc.

This application is a continuation of PCT Application No. PCT/JP2017/003462, filed on Jan. 31, 2017, which is based upon and claims the benefit of priority from Japanese Patent Application No. 2016-017083 filed on Feb. 1, 2016. The contents of those applications are incorporated herein by reference in their entireties.

REFERENCE SYMBOLS

1: translucent structure, 2: translucent structure, 3: translucent substrate, 4: translucent substrate, 5: antiglare layer, 5a: first convex portions, 5b: second convex portions, 6: translucent structure, 7: antireflection layer (functional layer), 8: translucent structure, 9: water/oil-repellent layer (functional layer), BH: bearing height

What is claimed is:
1. A translucent structure, comprising:
a translucent substrate;
an antiglare layer formed on the translucent substrate and having an uneven structure at a surface thereof; and
at least one functional layer formed on the uneven structure of the antiglare layer, the at least one functional layer having an uneven structure at a surface thereof forming an outermost surface of the translucent structure,
wherein the uneven structure of the at least one functional layer follows the uneven structure of the antiglare layer such that external light is diffusely reflected by the uneven structure of the outermost surface of the translucent structure, the uneven structure of the outermost surface of the translucent structure includes first convex portions, such that diameters calculated as true circles of the first convex portions at a bearing height of a shape of the surface plus 0.05 μm are at least 1 μm, that an average value of the diameters of the first convex portions is from 1.000 to 16.000 μm, and that a density of the first convex portions is from 0.001 to 0.1 units/μm$^2$, wherein the bearing height of the shape of the surface is obtained by measuring a rectangular region of from 101 μm×135 μm to 111 μm×148 μm of the uneven structure by a laser microscope, when an image having a plurality of convex portions is obtained by filtering the shape of the surface of the antiglare layer by image processing software SPIP (manufactured by Image Metrology) to obtain a smoothing image and subtracting XYZ data of the smoothing image from XYZ data of the shape of the surface, the plurality of convex portions includes second convex portions such that diameters calculated as true circles of the second convex portions at a height of 0.01 μm when a bearing height is deemed to be 0, are at least 0.4 μm, that a density of the second convex portions is from 0.023 to 7.210 units/μm$^2$, and that the total area in a cross section of the second convex portions at the height of 0.01 μm is from 0.900 to 90.000% of the entire area of the rectangular region, and the translucent structure is a display of an image display device.

2. The translucent structure according to claim 1, wherein the average value of the diameters of the first convex portions is from 1.000 to 12.000 μm, the density of the second convex portions is from 0.023 to 0.180 unit/μm$^2$, and the total area in the cross section of the second convex portions is from 1.000 to 22.400% of the entire area of the rectangular region.

3. The translucent structure according to claim 2, wherein the average value of the diameters of the first convex portions is from 1.000 to 8.000 μm, the density of the second convex portions is from 0.033 to 0.180 unit/μm$^2$, and the total area in the cross section of the second convex portions is from 1.270 to 16.000% of the entire area of the rectangular region.

4. The translucent structure according to claim 1, wherein the antiglare layer is directly formed on the translucent substrate.

5. The translucent structure according to claim 4, wherein the antiglare layer is a film composed mainly of silica and having a pencil hardness in accordance with JIS K5600-5-4 of at least 5H.

6. The translucent structure according to claim 1, wherein the at least one functional layer comprises a water/oil-repellent layer such that a surface of the water/oil-repellent layer forms the outermost surface of the translucent structure.

7. The translucent structure according to claim 1, wherein a surface of the translucent substrate on which the antiglare layer is formed has arithmetic average roughness Ra of at most 10 nm.

8. The translucent structure according to claim 1, wherein the translucent substrate is a plate-form or film-form inorganic glass or resin material.

9. The translucent structure according to claim 1, wherein the at least one functional layer comprises an antireflection layer or a water/oil repellent layer.

10. The translucent structure according to claim 1, wherein the at least one functional layer comprises an antireflection layer and a water/oil repellent layer.

11. The translucent structure according to claim 1, which has a haze factor of from 0.1 to 15%.

12. The translucent structure according to claim 1, which is entirely curved, or at least partially curved.

13. The translucent structure according to claim 12, which comprises a curved part and a flat part.

14. The translucent structure according to claim 13, wherein a radius of curvature of the curved part is at most 25,000 mm.

15. The translucent structure according to claim 13, wherein a radius of curvature of the curved part is from 30 to 3,000 mm.

16. The translucent structure according to claim 9, wherein the antireflection layer comprises a low refractive index layer and a high refractive index layer such that the low refractive index layer and the high refractive index layer are alternately laminated.

17. The translucent structure according to claim 16, wherein the low refractive index layer comprises silicon oxide ($SiO_2$), and the high refractive index layer comprises at least one selected from the group consisting of niobium oxide ($Nb_2O_5$), titanium oxide ($TiO_2$), zirconium oxide ($ZrO_2$), silicon nitride (SiN) and tantalum oxide ($Ta_2O_5$).

18. The translucent structure according to claim 1, wherein the density of the first convex portions is from 0.001 to 0.05 units/μm$^2$.

19. The translucent structure according to claim 1, wherein the density of the second convex portions is from 0.023 to 0.180 units/μm$^2$.

20. The translucent structure according to claim 1, wherein the antiglare layer comprises silica particles having an average particle diameter of 70 to 110 nm.

* * * * *